US007539040B2

(12) United States Patent
Tamai et al.

(10) Patent No.: US 7,539,040 B2
(45) Date of Patent: May 26, 2009

(54) NONVOLATILE SEMICONDUCTOR MEMORY DEVICE

(75) Inventors: Yukio Tamai, Tsuchiura (JP); Akihito Sawa, Tsukuba (JP)

(73) Assignees: Sharp Kabushiki Kaisha, Osaka (JP); Institute of Advanced Industrial Science and Technology, Tokyo (JP)

(*) Notice: Subject to any disclaimer, the term of this patent is extended or adjusted under 35 U.S.C. 154(b) by 129 days.

(21) Appl. No.: 11/878,039

(22) Filed: Jul. 20, 2007

(65) Prior Publication Data
US 2008/0025072 A1    Jan. 31, 2008

(30) Foreign Application Priority Data
Jul. 28, 2006    (JP)    ............... 2006-206678

(51) Int. Cl.
*G11C 11/00*    (2006.01)
(52) U.S. Cl. ..................... 365/148; 365/100
(58) Field of Classification Search ........... 365/148, 365/100, 158
See application file for complete search history.

(56) References Cited

U.S. PATENT DOCUMENTS

| | | | | |
|---|---|---|---|---|
| 5,828,604 | A  * | 10/1998 | Kawai et al. | 365/185.22 |
| 6,791,890 | B2 * | 9/2004 | Ooishi | 365/189.15 |
| 6,838,720 | B2 | 1/2005 | Krieger et al. | |
| 6,992,934 | B1 * | 1/2006 | Sarin et al. | 365/185.23 |
| 2004/0036109 | A1 | 2/2004 | Inoue et al. | |
| 2004/0171215 | A1 | 9/2004 | Hsu et al. | |
| 2004/0257864 | A1 | 12/2004 | Tamai et al. | |
| 2008/0232161 | A1 * | 9/2008 | Choi et al. | 365/163 |

FOREIGN PATENT DOCUMENTS

WO    2006/036622 A1    4/2006
WO    2006/071683 A1    7/2006

OTHER PUBLICATIONS

Liu et al., "Electric-pulse-induced reversible resistance change effect in magnetoresistive films," Applied Physics Letters, vol. 76, No. 19, May 8, 2000, pp. 2749-2751.
Seo et al., "Reproducible resistance switching in polycrystalline NiO films," Applied Physics Letters, vol. 85, No. 23, Dec. 6, 2004, pp. 5655-5657.
Sim et al., "Resistance-Switching Characteristics of Polycrystalline $Nb_2O_5$ for Nonvolatile Memory Application," IEEE Electron Device Letters, vol. 26, No. 5, May 2005, pp. 292-294.
Sawa et al., "Hysteretic current-voltage characteristics and resistance switching at a rectifying $Ti/Pr_{0.7}Ca_{0.3}MnO_3$ interface," Applied Physics Letters, vol. 85, No. 18, Nov. 1, 2004, pp. 4073-4075.
Fujii et al., "Hysteretic current-voltage characteristics and resistance switching at an epitaxial oxide Schottky junction $SrRuO_3/SrTi_{0.99}Nb_{0.01}O_3$," Applied Physics Letters 86, 12107-1 through 012107-3, 2005.

* cited by examiner

*Primary Examiner*—Anh Phung
(74) *Attorney, Agent, or Firm*—Nixon & Vanderhye, P.C.

(57)    ABSTRACT

A nonvolatile semiconductor memory device comprises a memory cell including a variable resistance element changing its electric resistance by voltage application and having current-voltage characteristics in which a positive bias current flowing when a positive voltage is applied from one electrode as a reference electrode to the other electrode through an incorporated rectifier junction is larger than a negative bias current, a memory cell selection circuit for selecting the memory cell from the memory cell array, a voltage supply circuit for supplying a voltage to the memory cell so that a predetermined positive voltage corresponding to the reading operation is applied to the other electrode of the variable resistance element, in the reading operation, and a readout circuit for detecting the amount of the positive bias current and reading the information stored in the selected memory cell, in order to suppress the reading disturbance of the memory cell.

12 Claims, 21 Drawing Sheets

US 7,539,040 B2

NONVOLATILE SEMICONDUCTOR MEMORY DEVICE

CROSS REFERENCE TO RELATED APPLICATION

This Nonvolatile application claims priority under 35 U.S.C. §119(a) on Patent Application No. 2006-206678 filed in Japan on 28 Jul., 2006 the entire contents of which are hereby incorporated by reference.

BACKGROUND OF THE INVENTION

1. Field of the Invention

The present invention relates to a nonvolatile semiconductor memory device having a memory cell array in which memory cells each comprising a variable resistance element storing information by the change of an electric resistance are arranged in a row direction and a column direction, and more particularly, to a technique for preventing and suppressing the deterioration of stored data due to the reading operation of the memory cell array.

2. Description of the Related Art

Recently, there has been proposed a variable resistance type of memory element (referred to as the variable resistance element hereinafter) having a two-terminal structure in which a metal oxide is sandwiched by conductors serving as electrodes, and capable of changing its electric resistance reversibly by applying a voltage pulse. Various kinds of variable resistance elements are proposed and disclosed by combining oxide materials and electrode materials (or example, refer to document 1: Japanese Laid-Open Patent Publication No. 2004-087069, document 2: Liu, S. Q. et al., "Electric-pulse-induced reversible Resistance change effect in magnetoresistive films", Applied Physics Letter, Vol. 76, 2749, in 2000, document 3: Seo, S. et al., "Reproducible Resistance Switching in polycrystalline NiO films", Applied Physics Letters, Vol. 85, 5655, in 2004, document 4: Sim, H et al., "Resistance-switching characteristics of polycrystalline $Nb_2O_5$ for nonvolatile memory application", IEEE Electron Device letters, Vol. 26, 292, in 2005, document 5: Sawa, A. et al., "Hysteretic current-voltage characteristics and resistance switching at rectifying $Ti/Pr_{0.7}Ca_{0.3}MnO_3$ interface", Applied Physics Letters, Vol. 85, 4073, in 2004, and document 6: Fujii, T. et al., "Hysteretic current-voltage characteristics and resistance switching at an epitaxial oxide Schottky junction $SrRuO_3/SrTi_{0.99}Nb_{0.01}O_3$", Applied Physics Letters, Vol. 86, 12107, in 2005), and each provides distinctive electric characteristics and varies in operation mechanism. Every variable resistance element uses a reversible resistance changing operation (referred to as the "switching operation" occasionally hereinafter) and can be used as a new nonvolatile semiconductor memory device by relating information to a resistance value and reading the resistance value or a current corresponding the resistance value. Here, the information includes binary digital data, a multilevel digital data, analog data and the like, and the high resistance state and the low resistance state are stored as the binary digital data "1" and "0", the multilevel digital data can be stored using a middle resistance value between the high resistance state and the low resistance state, or the analog data may be stored.

There can be constituted a nonvolatile semiconductor memory device by forming a memory cell array in which memory cells comprising the variable resistance element and storing information by the change of the electric resistance of the variable resistance element are arranged in a row direction and column direction in a matrix state, and providing a circuit for controlling programming, erasing and reading operation of data for each memory cell of the memory cell array in the vicinity of the memory cell array.

The constitution of the memory cell comprising the variable resistance element includes a case where each memory cell comprises a series circuit consisting of the variable resistance element and a transistor as a cell-access element (1T/1R-type memory cell), a case where each memory cell comprises a series circuit consisting of the variable resistance element and a diode as a cell-access element (1D/1R-type memory cell), a case where each memory cell comprises a variable resistance element only (1R-type memory cell) and the like. The 1T/1R-type memory cell and its memory cell array, for example are disclosed in the document 1 by the applicant of this application (refer to FIG. 1, for example). The 1D/1R-type memory cell, for example is disclosed in Japanese Laid-Open Patent Publication No. 2004-260162 by the applicant of this application (refer to FIG. 1, for example). The 1R-type memory cell, for example is disclosed in Japanese Laid-Open Patent Publication No. 2005-32401 (refer to FIG. 4, for example).

When data is read from the memory cell comprising the variable resistance element, a bias voltage is applied to the variable resistance element to flow a reading current and the resistance value of the variable resistance element is determined by the amount of the current, so that the data is read. Therefore, regardless of the constitution of the memory cell, a predetermined bias voltage is applied to the variable resistance element in the reading operation. When a phenomenon in which the resistance value of the variable resistance element is changed a little by the bias voltage applied at the time of this reading operation (referred to as the "reading disturbance" occasionally hereinafter) is repeated, recorded information could be lost in the worst case. Therefore, it is necessary to reduce the degree and frequency of the reading disturbance as much as possible.

As described above, although there are various kinds of nonvolatile variable resistance element capable of changing the electric resistance reversibly by applying the voltage pulse, the behavior of the reading disturbance in the variable resistance element is not clear.

The inventors have found that in the case where the variable resistance element showing the rectifying characteristics disclosed in the document 5 (Sawa, A. et al.) or the document 6 (Fujii, T. et al.) is used, when a reading voltage whose absolute value is not more than a programming voltage is applied to the variable resistance element continuously, the resistance value of the variable resistance element is changed and the resistance value is considerably changed depending on the polarity of the reading voltage. In addition, the variable resistance element showing the rectifying characteristics denotes that the variable resistance element itself has the rectifying characteristics and does not mean that when the memory cell comprises a series circuit consisting of the variable resistance element and a diode as a cell-access element, the memory cell has the rectifying characteristics.

FIG. 1 shows current-voltage characteristics in a high resistance state and a low resistance state of the variable resistance element disclosed in the document 5 (Sawa, A. et al.) and comprising three layers $Ti/Pr_{0.7}Ca_{0.3}MnO_3$ (PCMO)/$SrRuO_3$ (SRO) manufactured by a similar method to that disclosed in the document 5 (Sawa, A. et al.). An upper electrode is Ti and an applied voltage in FIG. 1 is the potential of the upper electrode based on a lower electrode. Referring to FIG. 1, since a negative bias current when a negative voltage is applied (at the time of negative bias) is larger than a positive bias current when a positive voltage is applied (at the time of positive bias), forward bias is provided for the rectifying characteristics at the time of negative bias while reverse bias is provided for the rectifying characteristics at the time of positive bias. In addition, when the potential of the lower electrode based on the upper electrode is defined as the applied voltage, the above relation is reversed. Furthermore, the forward bias is defined by an applied voltage polarity in which a larger current flows to the variable resistance element.

In addition, according to the current-voltage characteristics shown in FIG. 1, when the current-voltage characteristics in the high resistance state is compared with that in the low resistance state, a current difference is largely provided in both forward bias and reverse bias, so that the high resistance state and the low resistance state can be determined in the reading operation in both forward bias and reverse bias.

However, the inventors of the present invention has found that the degree of the reading disturbance is considerably different between the reading operation in the forward bias (forward reading) and the reading operation in the reverse bias (reverse reading). FIG. 2 shows graphs in which the change in resistance value is plotted with a reading voltage applying time (reading voltage pulse applying number of times) when the forward reading and reverse reading are performed for variable resistance elements in the low resistance state and in the high resistance state. The change in resistance value is shown relatively assuming that the resistance value just after the variable resistance element becomes the low resistance state or high resistance state is set to 1, which denotes that the characteristics becomes undesirable as the resistance value (relative value) becomes far from 1. It can be seen from FIG. 2 that the resistance value change is larger when the reverse reading is performed in the low resistance state than the other case. In addition, since the resistance value in the above reading operation tends to increase, when the same reading operation is continued, the resistance state is changed from the low resistance state to the high resistance state, so that recorded information is lost.

Thus, it is clear from the above experimental result that the reading disturbance phenomenon is such that the data stored in the memory cell, that is, the resistance value is changed with the voltage applying time (number of times for applying a pulse) in the reading operation. Especially, the resistance value of the variable resistance element is considerably changed when the reading operation is performed by applying the reading voltage to the variable resistance element in the low resistance state in the reverse bias, so that when the same reading operation to the same memory cell is repeated, stored data could be completely lost and could not read in the worse case.

Furthermore, since in the case of the memory cell array comprising the 1R-type memory cell, the reading voltage is also applied to the selected memory cell that is not to be read but shares the word line or bit line with the memory cell to be read, the above reading disturbance phenomenon appears more notably, so that it is highly necessary to prevent the reading disturbance phenomenon as compared with the other memory cell types.

SUMMARY OF THE INVENTION

The present invention was made in view of the above problems and it is an object of the present invention to provide a nonvolatile semiconductor memory device having a memory cell array in which memory cells each comprising a variable resistance element storing information by the change of an electric resistance due to voltage application are arranged in a row direction and a column direction and to prevent a resistance value of the variable resistance element from being changed due to the voltage application to the memory cell at the time of reading to keep its reading margin preferable.

A nonvolatile semiconductor memory device according to the present invention to attain the above object has a memory cell array comprising a plurality of memory cells arranged in a row direction and a column direction, and the memory cell comprises a variable resistance element having a laminated structure comprising a rectifier junction showing rectifying characteristics in current-voltage characteristics and two electrodes for applying a voltage to the rectifier junction, the variable resistance element exhibiting current-voltage characteristics so that a positive bias current flowing when a positive voltage is applied based on one of the two electrodes as a reference electrode to the other electrode is larger than a negative bias current flowing when a negative voltage is applied to the other electrode, the current-voltage characteristics is asymmetric with respect to a voltage polarity applied to the other electrode, and the variable resistance element being capable of storing information by the change of the electric resistance due to the voltage application between the two electrodes, and it is first characterized by comprising a memory cell selection circuit for selecting the memory cell from the memory cell array by the row, column or memory cell; a voltage supplying circuit for supplying a predetermined voltage according to a writing operation and reading operation, to one or more selected memory cells selected by the memory cell selection circuit through the memory cell selection circuit; and a readout circuit for reading the information stored in the selected memory cell by detecting the amount of a reading current flowing in accordance with the voltage applied to the variable resistance element of the selected memory cell and the resistance state of the variable resistance element, in the reading operation for the selected memory cell, wherein the memory cell selection circuit and the voltage supplying circuit apply a predetermined positive voltage according to the reading operation based on the reference electrode to the other electrode in the variable resistance element of the selected memory cell, and the readout circuit detects the amount of the positive bias current flowing from the other electrode to the reference electrode to read the information stored in the selected memory cell, in the reading operation for the selected memory cell.

The nonvolatile semiconductor memory device according to the first characteristics is second characterized in that the memory cell selection circuit selects the memory cell from the memory cell array by the row or column.

The nonvolatile semiconductor memory device according to the first or second characteristics is third characterized in that the memory cell comprises the variable resistance element only, the memory cell array comprises a plurality of row selection lines extending in a row direction and a plurality of column selection lines extending in a column direction, each of the memory cells in the same row is connected at one end of the variable resistance element to the same row selection line, and each of the memory cells in the same column is connected at the other end of the variable resistance element to the same column selection line.

The nonvolatile semiconductor memory device according to the first characteristics is fourth characterized in that the memory cell comprises a series circuit consisting of the variable resistance element and a cell-access transistor, the memory cell array comprises a plurality of row selection lines extending in a row direction and a plurality of column selection lines extending in a column direction, each of the memory cells in the same row is connected at the gate of the cell-access transistor to the same row selection line, each of the memory cells in the same column is connected at one end of the series circuit to the same column selection line, each of the memory cells is connected at the other end of the series circuit to a source line, and the memory cell selection circuit selects at least one from the memory cells in the same row in the memory cell array.

The nonvolatile semiconductor memory device according to the first or second characteristics is fifth characterized in that the memory cell comprises a series circuit consisting of the variable resistance element and a cell-access diode, the memory cell array comprises a plurality of row selection lines extending in a row direction and a plurality of column selection lines extending in a column direction, each of the memory cells in the same row is connected at one end of the series circuit to the same row selection line, each of the memory cells in the same column is connected at the other end of the series circuit to the same column selection line, and the memory cell selection circuit selects at least one from the memory cells in the same row or column in the memory cell array.

The nonvolatile semiconductor memory device according to any one of the first to fifth characteristics is sixth characterized in that the rectifier junction is a schottky junction.

The nonvolatile semiconductor memory device according to any one of the first to fifth characteristics is seventh characterized in that the rectifier junction is a p-n junction.

The nonvolatile semiconductor memory device according to any one of the first to fifth characteristics is eighth characterized in that the rectifier junction is a hetero junction.

The nonvolatile semiconductor memory device according to the eighth characteristics is ninth characterized in that the hetero junction is a p-n junction.

The nonvolatile semiconductor memory device according to the eighth embodiment is tenth characterized in that the hetero junction comprises semiconductors having the same conductivity type.

The nonvolatile semiconductor memory device according to any one of the first to tenth embodiment is eleventh characterized in that at least one of the two materials constituting the rectifier junction is a perovskite-type metal oxide.

The nonvolatile semiconductor memory device according to any one of the first to tenth embodiment is twelfth characterized in that the two materials constituting the rectifier junction are a perovskite-type metal oxide.

According to the nonvolatile semiconductor memory device in the present invention, since the reading voltage applied to the variable resistance element of the selected memory cell to be read in the reading operation has the voltage applying polarity in which the positive bias current flows, that is, it is applied by the forward bias, the resistance change from the low resistance state to the high resistance state can be considerably suppressed. This is based on the new aspect found by the inventors of this application, as shown in FIG. 2, that when the reading voltage applied to the variable resistance element is the reverse bias, the resistance change from the low resistance state to the high resistance state becomes prominent as compared with the resistance change from the high resistance state to the low resistance state when the reading voltage applied to the variable resistance element is the forward bias. Thus, when the reading voltage is applied by the forward bias, that is, it is applied in the voltage polarity in which the positive bias current flows, the cumulative resistance change of the variable resistance element from the high resistance state or the low resistance state can be effectively suppressed, the reading margin is prevented from being lowered, and the number of reading times before the stored data is lost or the reading cannot be performed can be considerably improved.

In addition, according to the nonvolatile semiconductor memory device having the second characteristics, even when the memory cell is selected by the memory cell selection circuit by the row or column in the reading operation, since the reading voltage is applied to the variable resistance element of all the selected memory cells by the forward bias, the resistance change of the variable resistance element due to the reading disturbance can be effectively suppressed even in the case where the memory cell is selected by the row or column and the reading disturbance becomes prominent especially.

According to the nonvolatile semiconductor memory device having the third characteristics, even in the case of the 1R-type memory cell comprising the variable resistance element only, since the reading voltage is applied to the variable resistance element of the selected memory cell by the forward bias, the resistance change of the variable resistance element due to the reading disturbance can be effectively suppressed even in the case where the memory cell is selected by the row or column and the reading disturbance becomes prominent especially.

According to the nonvolatile semiconductor memory device having the fourth or fifth characteristics, even in the case of the 1T/1R-type memory cell having the series circuit comprising the variable resistance element and the cell-access transistor or the 1D/1R-type memory cell having the series circuit comprising the variable resistance element and the cell-access diode, since the forward biased reading voltage is applied to the variable resistance element of the selected memory cell, the resistance change of the variable resistance element due to the reading disturbance can be effectively suppressed. Especially, since the memory cell comprises the cell-access element comprising the transistor or the diode, the reading voltage applied to the unselected memory cell is prevented from being applied to the variable resistance element by controlling the cell-access element so as to be non-conductive, so that the resistance change of the variable resistance element due to the reading disturbance can be more effectively suppressed.

DETAILED DESCRIPTION OF THE INVENTION

Embodiments of a nonvolatile semiconductor memory device according to the present invention (referred to as the "device of the present invention" occasionally hereinafter) will be described with reference to the drawings hereinafter.

Figure 3:
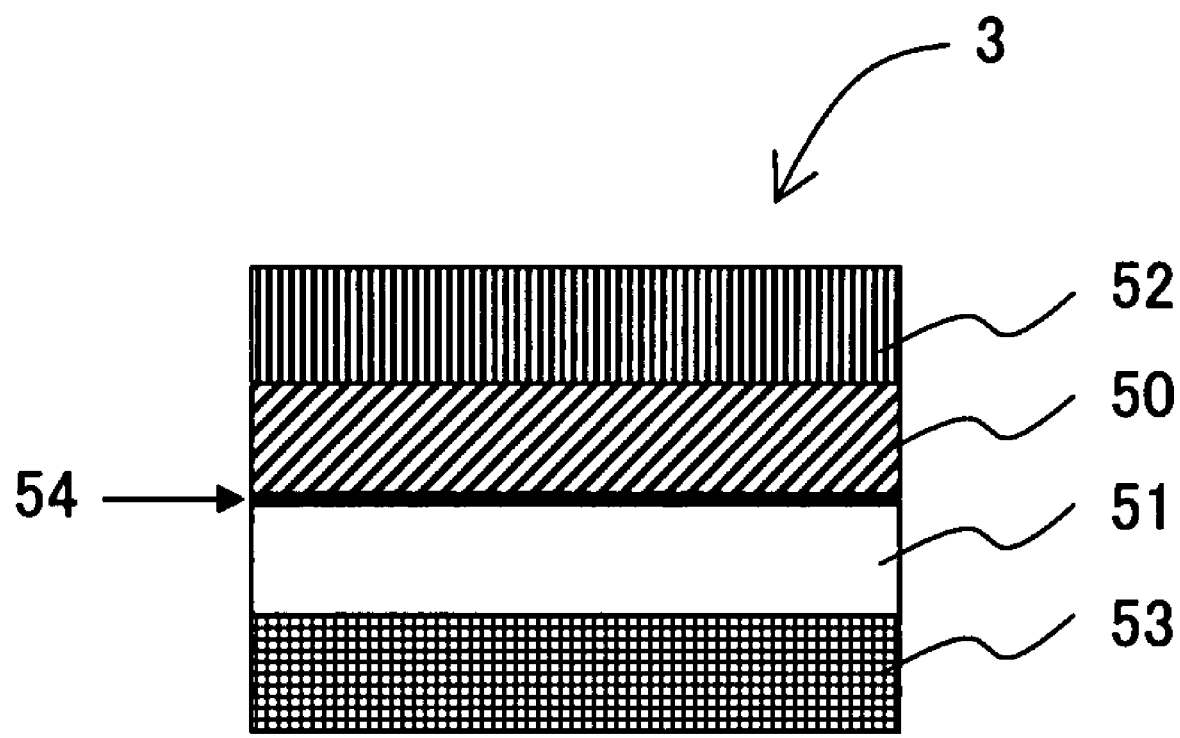
FIG. 3 is a sectional view showing a sectional structure of the variable resistance element constituting the memory cell of a nonvolatile semiconductor memory device according to the present invention.

First, the characteristics of a memory cell constituting a memory cell array of the device of the present invention that is common to each following embodiment will be described. According to each following embodiment, the memory cell comprises a variable resistance element that stores information by the change of an electric resistance. As shown in FIG. 3, a variable resistance element 3 comprises a rectifier junction 54 formed between a first variable resistance junction material 50 and a second variable resistance junction material 51, and first and second electrodes for applying a voltage to the rectifier junction 54, and has current-voltage characteristics asymmetric with respect to applied voltage characteristics in which the absolute values of currents flowing to the polarity of the voltage applied between the two electrodes 52 and 53 are different, that is, rectifying characteristics. Here, the word "rectifier" has the same meaning as the rectifying characteristics and the rectifier junction is a junction having the rectifying characteristics. The junction denotes an interface between two materials or a space-charge layer and the like in the vicinity of the interface. In addition, although the words anode and cathode are used for the electrode in the following description, the anode and the cathode are provided such that the absolute value of the current flowing when the potential of the anode is higher than that of the cathode is greater than the absolute value of the current flowing when the potential of the cathode is higher than that of the anode. Here, it is to be noted that the state in which the potential of the anode is higher than that of the cathode is called forward bias, and the state in which the potential of the cathode is higher than that of the anode is called reverse bias.

Figure 4:
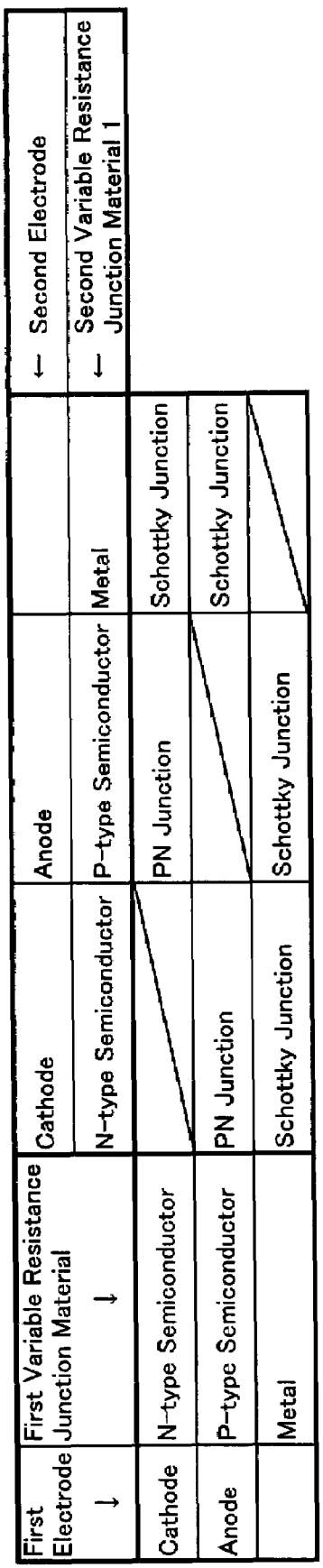
FIG. 4 is a table showing the corresponding relation between a constituent material of the variable resistance element shown in FIG. 3 and rectifying characteristics.

According to the rectifying characteristics of the variable resistance element 3, it is determined that which one of the two electrodes becomes the anode or cathode as the rectifier element by the kinds of the two variable resistance junction materials that form the junction. For example, in the case where the first variable resistance junction material 50 is metal of Ti and the second variable resistance junction material 51 is $Pr_{0.7}Ca_{0.3}MnO_3$ (PCMO: one example of perovskite-type metal oxide) whose conductivity type is p-type, the rectifier junction 54 formed by the two materials becomes a schottky junction, so that the first electrode and the second electrode for applying a voltage to this junction are cathode and anode, respectively. As the first electrode and the second electrode, it is desired to chose materials satisfying that the contact resistances to the first variable resistance junction material and the second variable resistance junction material, respectively are sufficiently smaller than the resistance of the rectifier junction 54, and an ohmic contact is more desirable. For example, the above-described Ti can be used as the first electrode and a strontium ruthenium oxide (SRO: $SrRuO_3$) can be used as the above-described PCMO. Therefore, according to this embodiment, the variable resistance element 3 exhibits asymmetric current-voltage characteristics (rectifying characteristics) in which the absolute value of a positive bias current flowing at the time of the forward bias when a positive voltage is applied from the first electrode 52 as a reference electrode to the second electrode 53 as the other electrode is greater than that of a negative bias current flowing at the time of reverse bias when a negative voltage is applied from the first electrode 52 as the reference electrode to the second electrode 53 as the other electrode. According to this embodiment, when the variable resistance element 3 is the rectifier element, the cathode is the first electrode 52 and the anode is the second electrode 53. However, other materials except for the above-described materials may be used for the first variable resistance junction material 50, the second variable resistance junction material 51, the first electrode 52 and the second electrode 53. When other materials are used, combinations are shown in FIG. 4. When the first variable resistance junction material 50 is metal and the second variable resistance junction material 51 is a semiconductor, the rectifier junction 54 is a schottky junction and the cathode and the anode are determined by the conductivity type of the semiconductor. That is, when the second variable resistance junction material 51 is a n-type semiconductor, the second electrode 53 connected to it is the cathode and the first electrode 52 on the opposite side is the anode. When the second variable resistance junction material 51 is a p-type semiconductor, the second electrode 53 connected to it is the anode and the first electrode 52 on the opposite side is the cathode. When the relation between the first variable resistance junction material 50 and the second variable resistance junction material 51 is reversed, the electrodes as the anode and the cathode are also reversed. In addition, when both the first variable resistance junction material 50 and second variable resistance junction material 51 are semiconductors, the rectifier junction 54 is a p-n junction and the electrode connected to the n-type semiconductor is the cathode and the electrode connected to the p-type semiconductor is the anode. For example, when the first variable resistance junction material 50 is lanthanum doped $SrTiO_3$ serving as the n-type semiconductor and the second variable resistance junction material 51 is PCMO serving as the p-type semiconductor, a variable resistance element having the rectifier junction in which the first electrode 52 is the cathode and the second electrode is the anode can be formed. Furthermore, although the case where both the first variable resistance junction material 50 and second variable resistance junction material 51 are the semiconductors having the same conductivity type is not shown in FIG. 4, the junction between the same conductivity type can be the rectifier junction. For example, even when both the first variable resistance junction material 50 and second variable resistance junction material 51 are the n-type semiconductors, as long as a hetero junction in which the conduction band of the first variable resistance junction material 50 is more close to a vacuum level than the conduction band of the second variable resistance junction material 51 is provided, the rectifier junction 54 in which the first electrode 52 is the cathode and the second electrode is the anode can be formed. When the energy positional relation between the conduction bands is reversed, the anode and the cathode are also reversed. When both the first variable resistance junction material 50 and second variable resistance junction material 51 are the p-type semiconductors, the electrode connected to one variable resistance junction material having a valence band that is farther from the vacuum level is the anode and the other electrode is the cathode. In addition, the first electrode 52 and the second electrode 53 may be formed of not only a single material but also a laminated electrode comprising a plurality of materials as long as they can apply a voltage to the rectifier junction 54.

Figure 1:
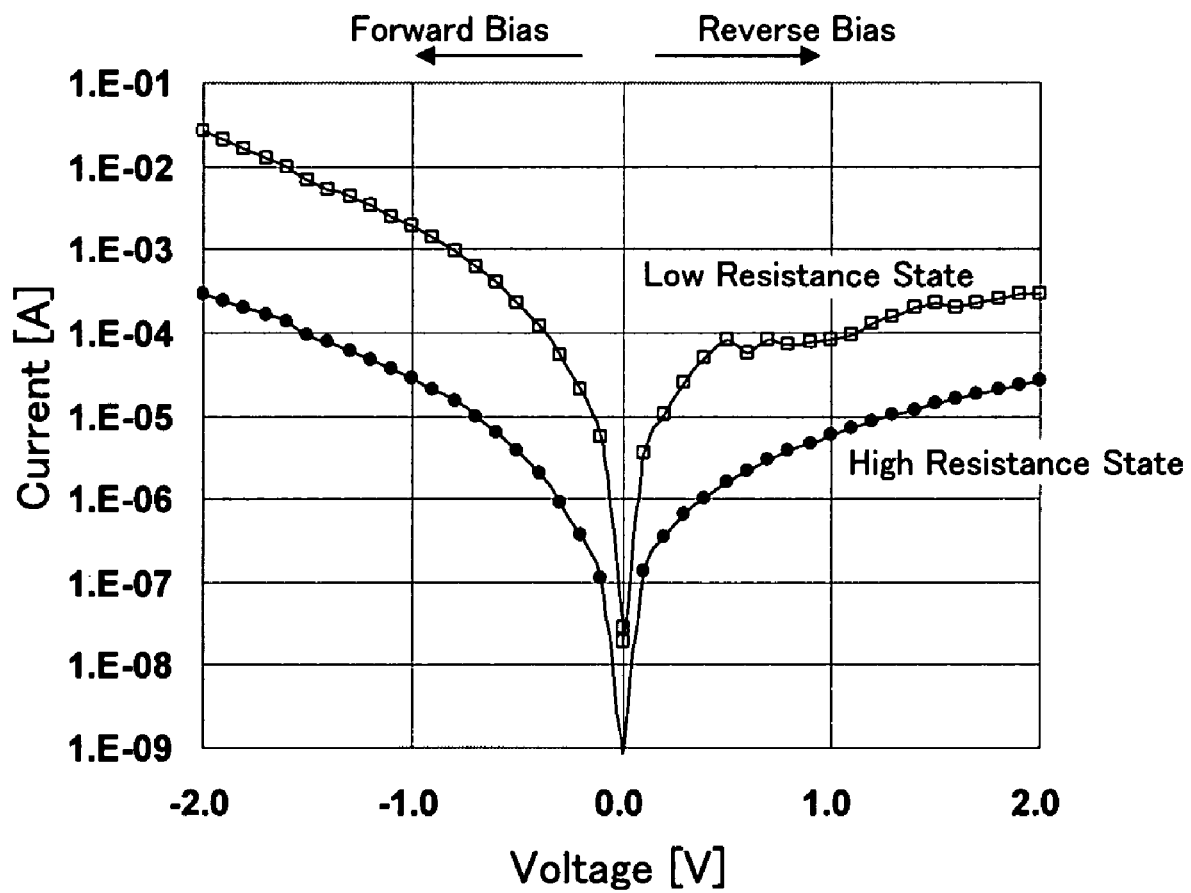
FIG. 1 is a view showing one example of current-voltage characteristics in the high resistance state and low resistance state of a variable resistance element comprising three layers of Ti/PCMO/SRO.
Figure 2:
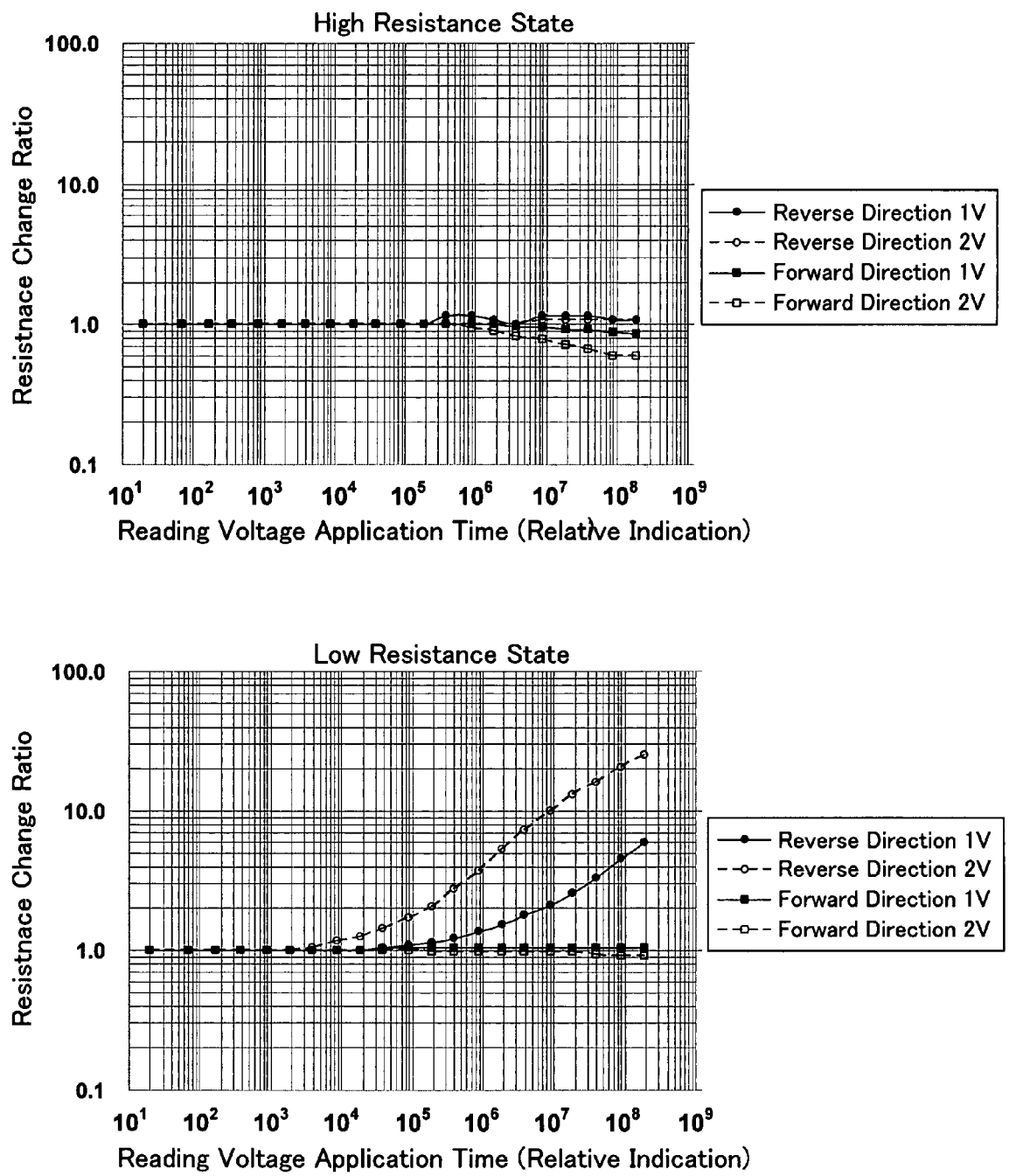
FIG. 2 is a plot showing the relation between a reading voltage applying time and a resistance change when a forward biased and a reverse biased reading voltage is applied to a variable resistance element having rectifying characteristics in the low resistance state or the high resistance state.

According to the memory cell constituting the memory cell array of the device of the present invention, since the variable resistance element itself has the rectifying characteristics, a phenomenon in which the resistance change accompanied by the application of a reading voltage to the variable resistance element is different depending on the applied voltage polarity as shown in FIG. 2, which is the new aspect of the inventors of this application described above. That is, when the variable resistance element is in the low resistant state, the resistance is considerably increased in the case where the reading voltage application is repeated in the reverse bias as compared with the resistance increase in the case where the reading voltage application is repeated in the forward bias. Thus, by setting the bias condition of the reading voltage at the time of the reading operation to the forward bias, the resistance change is prevented and the number of reading that can be performed from the writing to the next writing of the memory cell can be increased.

Next, the device according to the present invention and its reading operation based on the new aspect for the above variable resistance element will be described in detail with respect to each specific constitution of the memory cell.

First Embodiment

Figure 5:
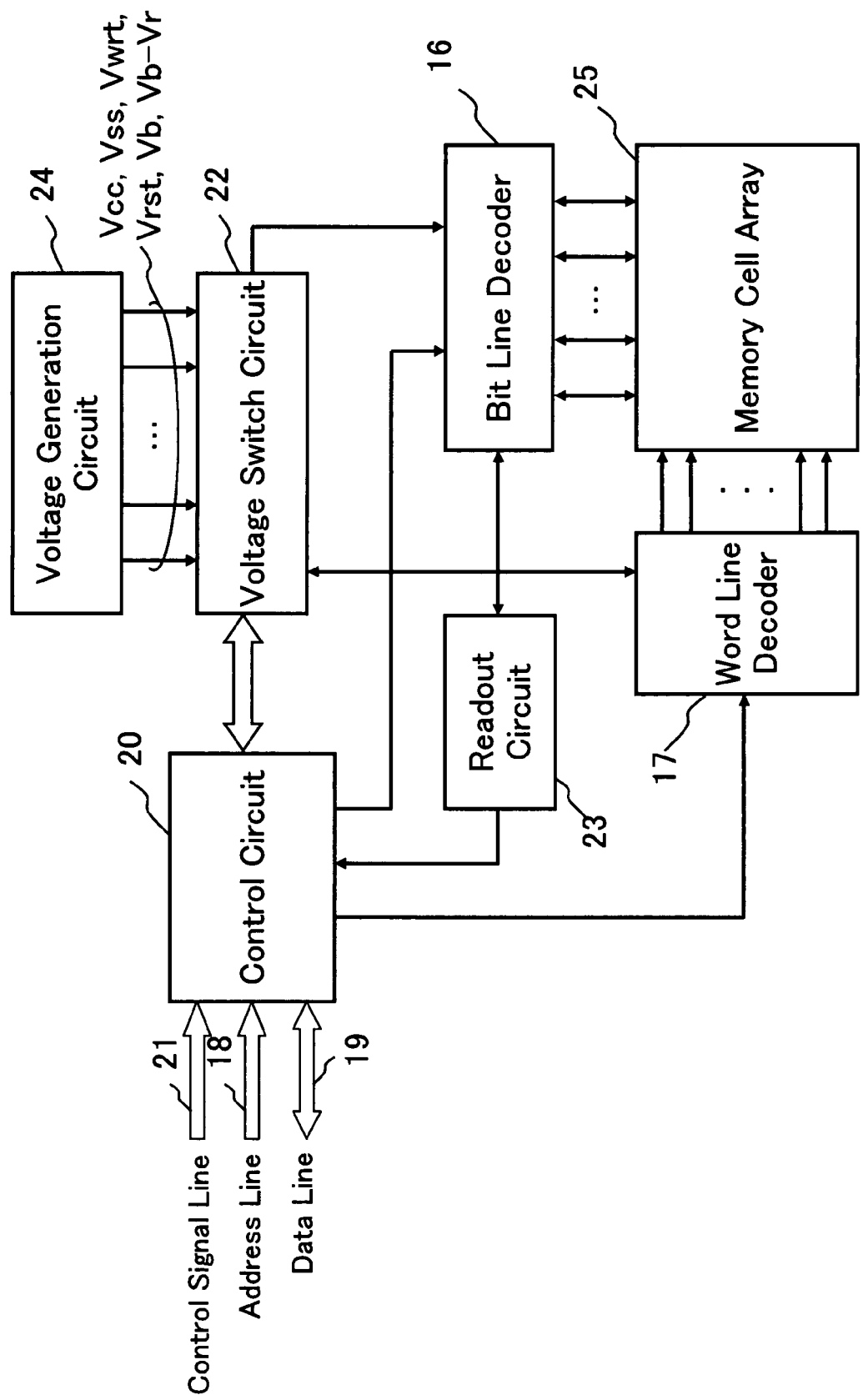
FIG. 5 is a block diagram showing the schematic circuit constitution example in a first embodiment of the nonvolatile semiconductor memory device according to the present invention.

FIG. 5 shows the schematic constitution of a device of the present invention according to a first embodiment. As shown in FIG. 5, the device of the present invention comprises a bit line decoder 16, a word line decoder 17, a voltage switch circuit 22, a readout circuit 23, a voltage generation circuit 24, and a control circuit 20 in the vicinity of a memory cell array 25 in which 1R-type memory cells are arranged in a matrix state.

Figure 6:
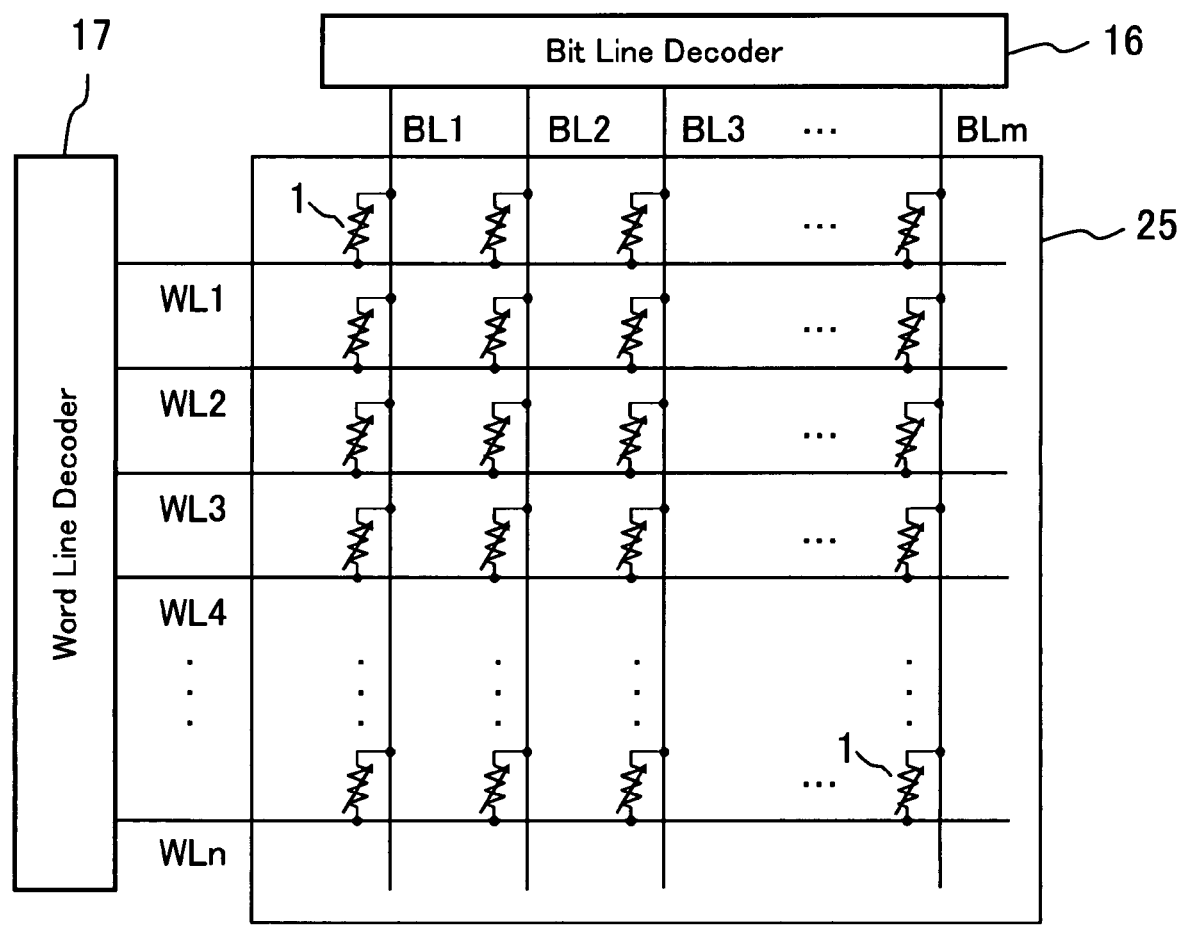
FIG. 6 is a schematic circuit diagram showing one constitution example of a memory cell array having a 1R-type memory cell comprising a variable resistance element only in the first embodiment of the nonvolatile semiconductor memory device according to the present invention.

As shown in FIG. 6, the memory cell array 25 is provided such that each of m×n memory cells 1 is disposed at each intersection of m bit lines extending in a column direction (corresponding to a column selection line) BL1 to BLm and n word lines extending in a row direction (corresponding to a row selection line) WL1 to WLn. The variable resistance element 3 constituting each memory cell 1 has the rectifying characteristics and it is connected to the word line and the bit line such that the current flowing from the bit line to the word line becomes a forward direction current (corresponding to a positive bias current). That is, the electrode as the anode determined by the materials of the variable resistance element as shown in FIG. 4 is connected to the bit line and the cathode is connected to the word line.

The bit line decoder 16 and the word line decoder 17 function as memory cell selection circuits for selecting the memory cell by the row, column or memory cell, and select the memory cell to be read or written corresponding to an address inputted from an address line 18 to the control circuit 20 from the memory cell array 25. The word line decoder 17 selects the word line of the memory cell array 25 corresponding to a signal inputted to the address line 18, and the bit line decoder 16 selects the bit line of the memory cell array 25 corresponding to an address signal inputted to the address line 18. According to this embodiment, the word line decoder 17 selects the memory cells from the memory cell array 25 by the row in the reading operation.

The control circuit 20 controls a writing operation (programming operation and erasing operation) and a reading operation of the memory cell array 25. The control circuit 20 controls the word line decoder 17, the bit line decoder 16, the voltage switch circuit 22, and the reading, programming and erasing operation of the memory cell array 25, based on the address signal inputted from the address line 18, data inputted from a data line 19 (at the time of programming), and a control signal inputted from a control signal line 21. According to the example shown in FIG. 5, the control circuit 20 comprises a general address buffer circuit, a data input/output buffer circuit, a control input buffer circuit although they are not shown.

The voltage switch circuit 22 functions as a voltage supply circuit for switching each voltage of the word line and the bit line needed for reading, programming and erasing in the memory cell array 25 according to an operation mode and supplying it to the memory cell array 25. In the reading mode especially, the voltage switch circuit 22 applies a predetermined voltage to be described below to the bit lines and the word line connected to the memory cells in one row selected by the word line decoder 17. According to this embodiment, the predetermined reading voltage is applied to the selected memory cells connected to one word line selected by the word line decoder 17. In the drawing, reference character Vcc denotes the power supply voltage of the device of the present invention, reference character Vss denotes the ground voltage, reference character Vwrt denotes a programming voltage, reference character Vrst denotes an erasing voltage, and reference character Vb denotes the bias voltage of the memory cell array. The voltage Vb−Vr is used in the reading operation and the reading is performed by applying the voltage Vb−Vr to the selected word line in the memory cell array biased to Vb (Vb is applied all of the word lines and bit lines). At this time, the voltage Vr (absolute value) is applied to the variable resistance elements of the selected memory cells as the reading voltage.

The readout circuit 23 converts reading current flowing in the one or more bit lines selected by the bit line decoder 16 among reading currents flowing in the bit lines connected to the selected memory cells, to a voltage to determine the state of stored data in the one or more memory cells to be read, connected to the one or more selected bit lines among the selected memory cells in one row and transfers its result to the control circuit 20 to be outputted to the data line 19.

Figure 7:
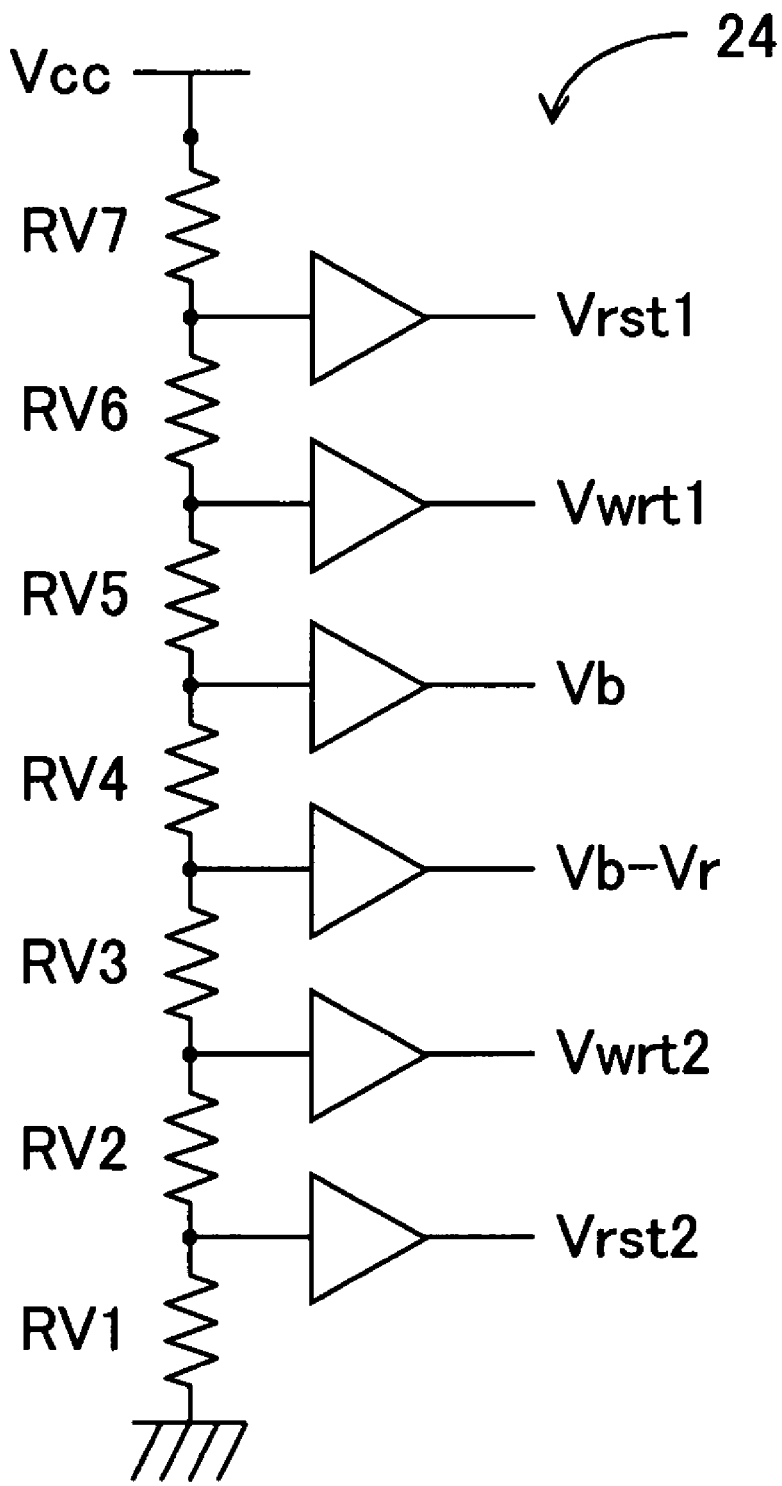
FIG. 7 is a circuit diagram showing one constitution example of a voltage generation circuit in the first embodiment of the nonvolatile semiconductor memory device according to the present invention.

The voltage generation circuit 24 generates a part or all of the voltages to be supplied to the memory cell array 25 through the voltage switch circuit 22 according to the operation mode. The voltage generation circuit 24 divides the power supply voltage Vcc by a resistance ladder circuit as shown in FIG. 7 to generate the desired voltage. However, the circuit constitution of the voltage generation circuit 24 is not limited to that shown in FIG. 7 as long as the desired voltage can be provided. Furthermore, a part or all of the voltages to be supplied to the memory cell array 25 through the voltage switch circuit 22 according to the operation mode may be supplied from the outside directly. In addition, voltage generation circuits 14, 34a and 34b in second to fourth embodiments are similar to the voltage generation circuit 24 in the first embodiment.

Figure 8:
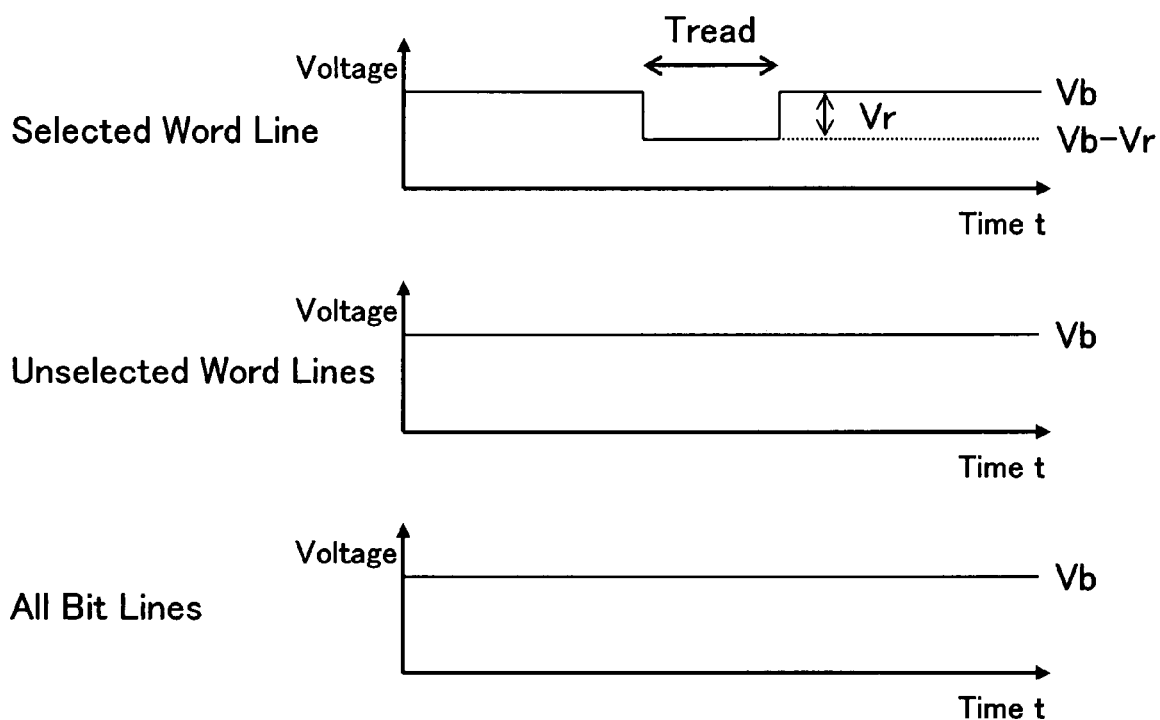
FIG. 8 is a view to explain voltage applying steps to the memory cell array in a reading operation in the first embodiment of nonvolatile semiconductor memory device according to the present invention.

Next, steps of applying the voltage to the memory cell array at the time of reading operation in the first embodiment will be described. As shown in FIG. 8, the memory cell array is biased to the voltage Vb initially. That is, the bias voltage Vb is applied to the selected word line connected to the one or more selected memory cells to be read out, unselected word lines other than the selected word line, and all bit lines (in this embodiment, all bit lines are connected to the selected memory cells). Then, only the selected word line connected to the cathode of the variable resistance element of each selected memory cell is biased to the voltage (Vb−Vr) only for a reading time Tread. Thus, the variable resistance elements of the selected memory cells are biased in forward direction, so that the forward current flows from each bit line to the selected word line. The readout circuit 23 detects the amount of the reading current flowing in each bit line to read the data of the selected memory cells. Thus, since the variable resistance elements of the selected memory cells are biased in the forward direction and read, the reading disturbance is suppressed. In addition, although it may be such that the amount of the reading current is detected by the reading circuit 23 only for one or more bit lines selected by the bit line decoder 16 and the data of the one or more selected memory cells that are selected by the bit line decoder 16 is read, the fact remains that the other memory cells that are not selected by the bit line decoder 16 are also forward biased.

Figure 9:
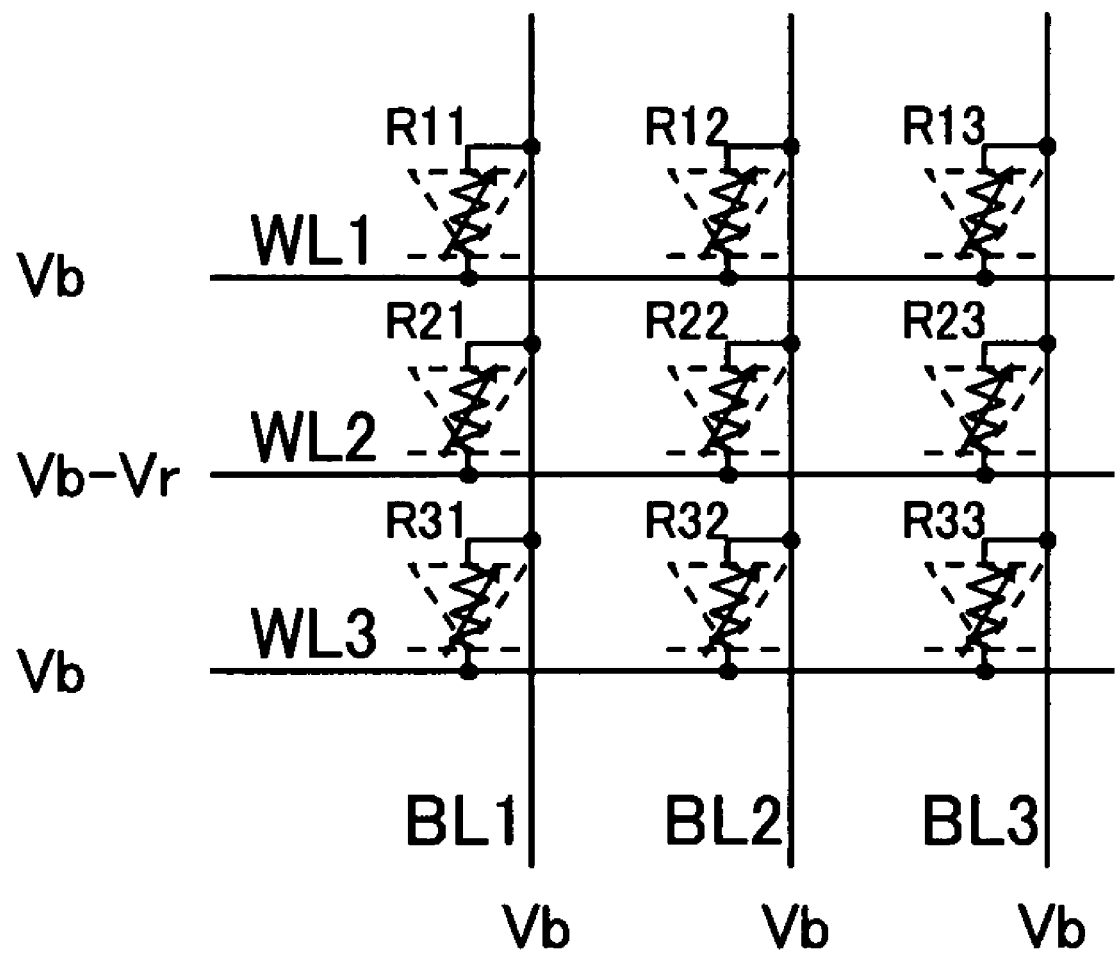
FIG. 9 is a view to explain voltage applying condition to the memory cell array in a reading operation in the first embodiment of nonvolatile semiconductor memory device according to the present invention.

Next, the state in the memory cell array for the reading time Tread in the reading operation will be described taking an example of three word lines and three bit lines shown in FIG. 9.

As described above, the variable resistance element of each memory cell is connected such that the current flows from the bit line to the word line in the forward direction. In FIG. 9, the variable resistance element is shown such that the signs of the variable resistance and diode are combined for simplicity.

The whole memory cell array is biased to Vb prior to the reading time and when a memory cell R22 is to be read, for example, the potential of the selected word line WL2 connected to the memory cell R22 is changed from the initial voltage Vb to the voltage Vb−Vr, whereby the forward reading current flows from the bit line B2 to the selected word line WL2 in the memory cell R22. The amount of the reading current is read by the readout circuit connected through the bit line decoder. Since the reading current flows also in memory cells R21 and R23 connected to the same selected word line WL2 other then the memory cell R22, these memory cells may be read out at the same time.

Second Embodiment

Although the description has been made of the case where the memory cell is the 1R-type memory cell in the first embodiment, a description will be made of a case where the memory cell is an 1T/1R-type memory cell hereinafter.

Figure 10:
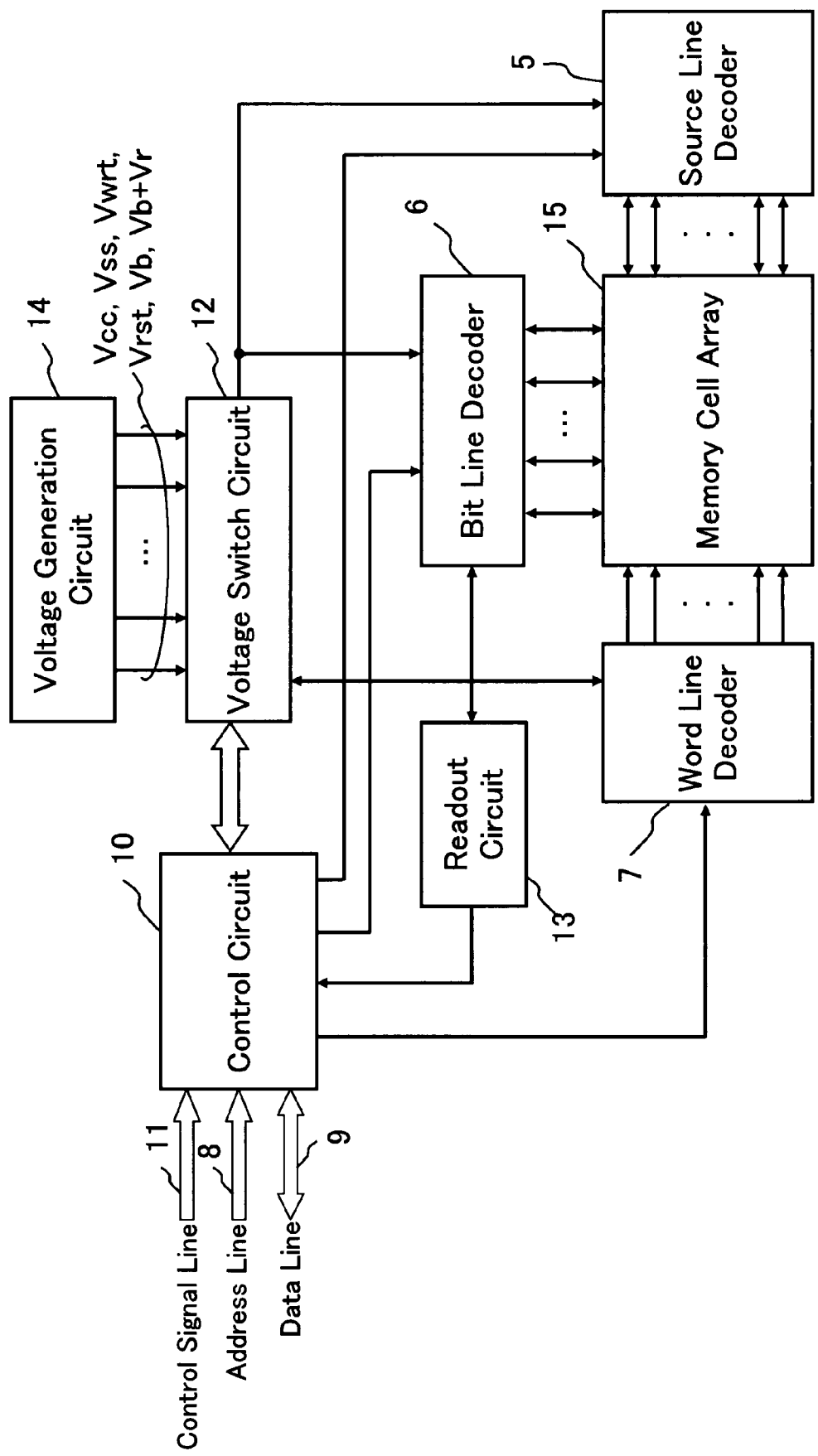
FIG. 10 is a block diagram showing the schematic circuit constitution example in a second embodiment of the nonvolatile semiconductor memory device according to the present invention.

FIG. 10 shows the schematic constitution of a device of the present invention according to a second embodiment. As shown in FIG. 10, the device of the present invention comprises a word line decoder 7, a bit line decoder 6, a source line decoder 5, a voltage switch circuit 12, a readout circuit 13, a voltage generation circuit 14, and a control circuit 10 in the vicinity of a memory cell array 15 in which 1T/1R-type memory cells are arranged in a matrix state. A specific memory cell in the memory cell array 15 corresponding to an address inputted from an address line 8 to the control circuit 10 is selected by the bit line decoder 6, the source line decoder 5 and the word line decoder 7 and the data is programmed, erased or read and the data is stored in the selected memory cell and read out. The data is exchanged with an external device (not shown) through a data line 9.

Figure 11:
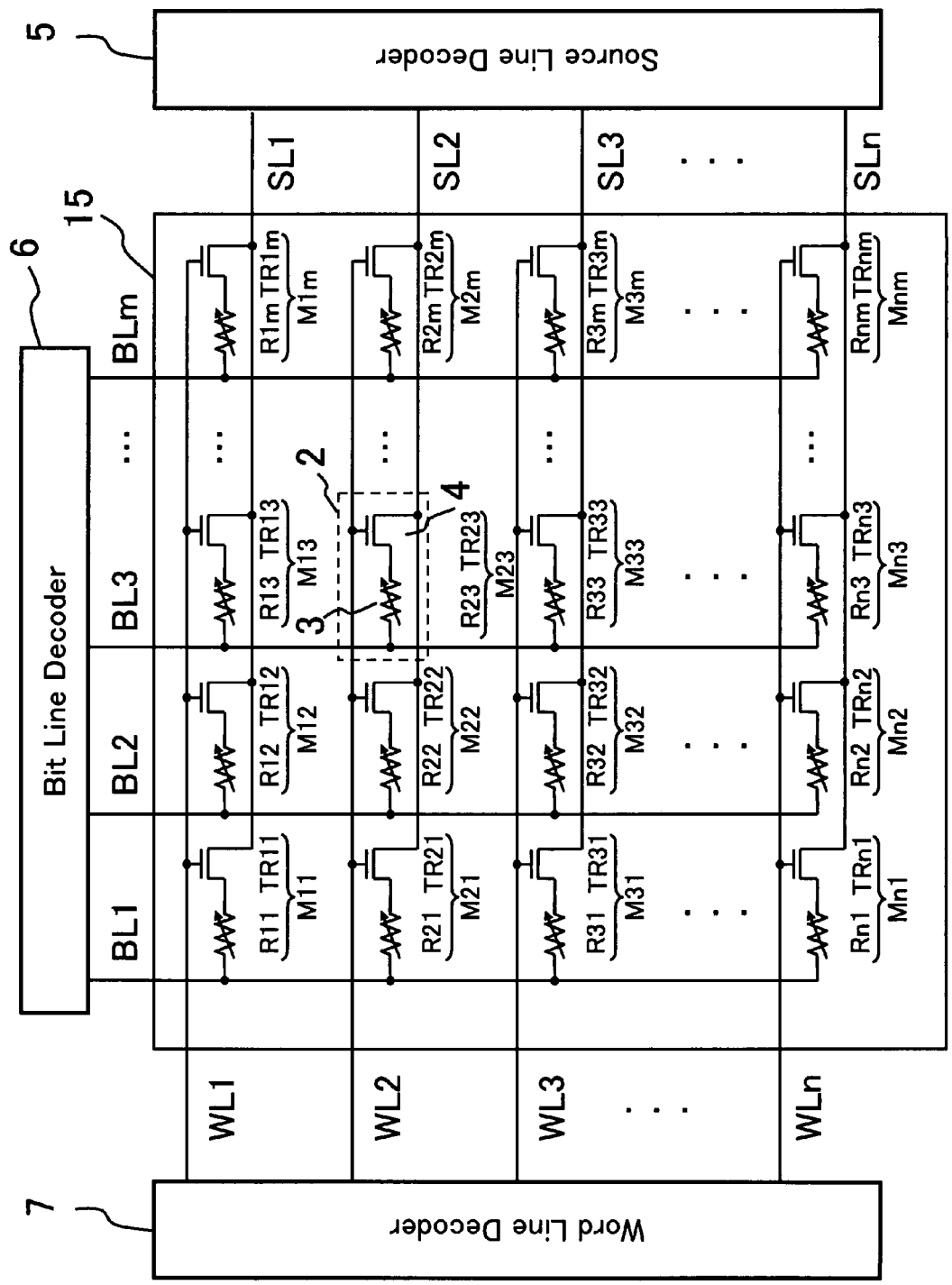
FIG. 11 is a schematic circuit diagram showing one constitution example of a memory cell array having a 1T/1R-type memory cell comprising the variable resistance element and a cell-access transistor in the second embodiment of the nonvolatile semiconductor memory device according to the present invention.

As shown in FIG. 11, the memory cell array 15 is constituted such that each of m×n memory cells 2 is arranged at each intersection of m bit lines BL1 to BLm extending in a column direction and n word lines WL1 to WLn extending in a row direction. In addition, n source lines SL1 to SLn are arranged in parallel to the word lines WL1 to WLn. Each memory cell 2 comprises a variable resistance element 3 and a transistor 4 serving as a cell-access element. The variable resistance element 3 constituting each memory cell 2 has rectifying characteristics and the variable resistance element 3 and the cell-access transistor 4 are connected to the bit line, word line, and source line such that the current flowing from the bit line to the source line becomes a forward current. That is, the electrode of the variable resistance element 3 serving as an anode determined by the material of the variable resistance element as shown in FIG. 4 is connected to the bit line, the electrode serving as a cathode is connected to the drain of the cell-access transistor 4, the source of the cell-access transistor 4 is connected to the source line, and the gate of the cell-access transistor 4 is connected to the word line.

The word line decoder 7 selects the word line of the memory cell array 15 corresponding to a signal inputted to the address line 8 and the bit line decoder 6 selects the bit line of the memory cell array 15 corresponding to an address signal inputted to the address line 8 and the source line decoder 5 selects the source line of the memory cell array 15 corresponding to the address signal inputted to the address line 8. The bit line decoder 6, the source line decoder 5, and the word line decoder 7 function as memory cell selection circuits for selecting at least one memory cell in the memory cell array 15 corresponding to the address inputted from the address line 8 to the control circuit 10.

The control circuit 10 controls programming, erasing and reading operations of the memory cell array 15. The control circuit 10 controls the word line decoder 7, the bit line decoder 6, the source line decoder 5, the voltage switch circuit 12, and the reading, programming and erasing operations of the memory cell array 15, based on the address signal inputted from the address line 8, the data inputted from the data line 9 (at the time of programming), and the control signal inputted from a control signal line 11. According to the example shown in FIG. 10, the control circuit 10 comprises a general address buffer circuit, a data input/output buffer circuit, a control input buffer circuit although they are not shown.

The voltage switch circuit 12 functions as a voltage supply circuit for switching each voltage of the word line, the bit line and source line needed for reading, programming and erasing in the memory cell array 15 according to an operation mode and supplying it to the memory cell array 15. In the reading mode especially, the voltage switch circuit 12 applies a predetermined voltage to be described below to the bit line and the word line connected to the selected memory cell through the bit line decoder 6, the source line decoder 5 and the word line decoder 7. In the drawing, reference character Vcc denotes the power supply voltage of the device of the present invention, reference character Vss denotes the ground voltage, reference character Vwrt denotes a programming voltage, reference character Vrst denotes an erasing voltage, and reference character Vb denotes a bias voltage of the memory cell array. The voltage Vb+Vr is used in the reading operation and the reading is performed by applying the voltage Vb+Vr to the selected bit line in the memory cell array biased to Vb (Vb is applied to all of the source lines and bit lines). At this time, a voltage Vr (absolute value) is applied to the variable resistance element of the selected memory cell as the reading voltage. In addition, when the bias voltage Vb is 0V, Vb+Vr=Vr.

In addition, the data is read from the memory cell array 15 through the bit line decoder 6 and the readiout circuit 13. The readout circuit 13 determines the state of data and transfers its result to the control circuit 10 to be outputted to the data line 9.

Figure 12:
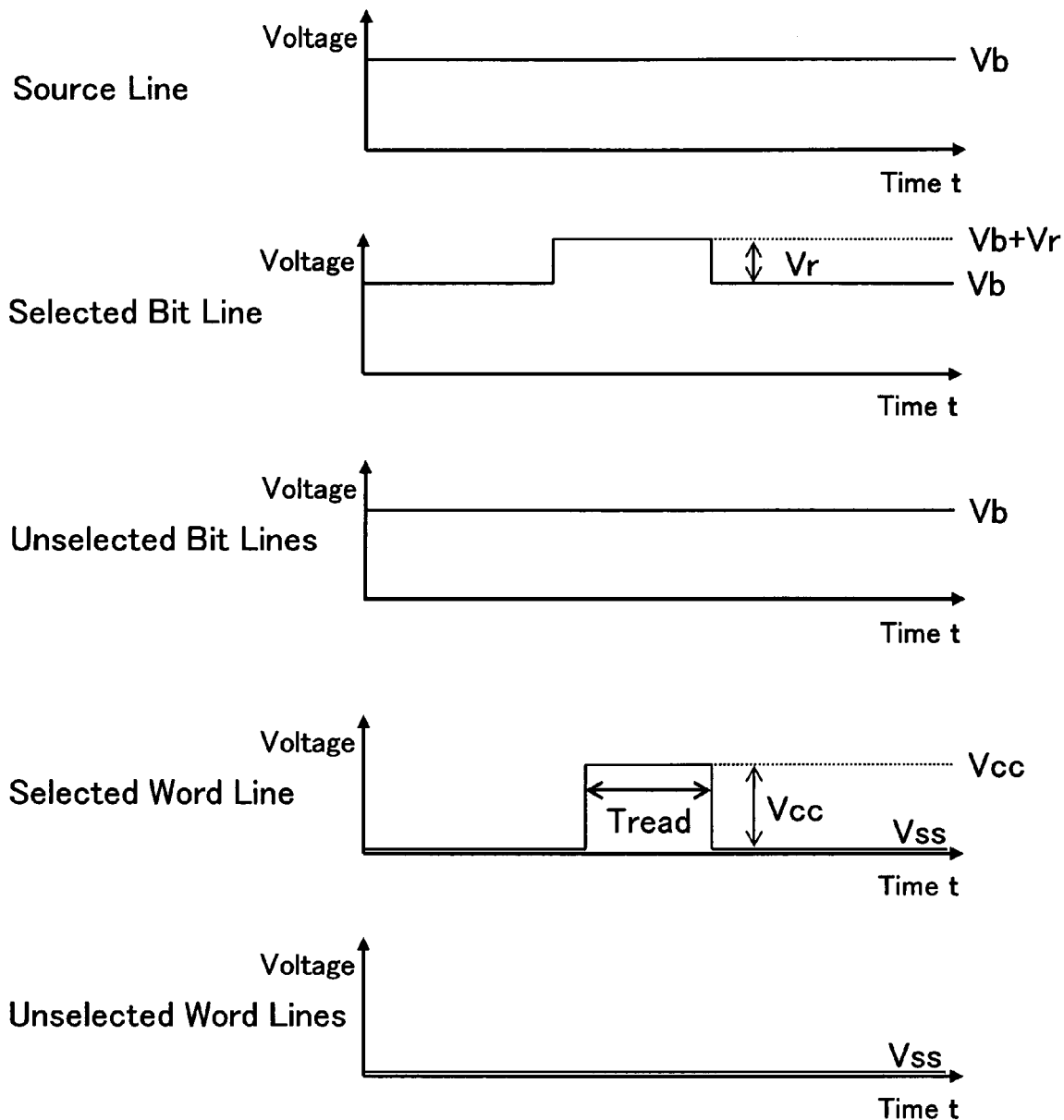
FIG. 12 is a view to explain voltage applying steps to the memory cell array in a reading operation in the second embodiment of nonvolatile semiconductor memory device according to the present invention.

Next, steps of applying the voltage to the memory cell array at the time of reading operation in the second embodiment will be described. As shown in FIG. 12, in the memory cell array, all of the bit lines and source lines are biased to the voltage Vb and all of the word lines are biased to the ground voltage Vss (0V) and all of the cell-access transistors of the memory cells are off initially. Then, only the selected bit line connected to the anode of the variable resistance element of the selected memory cell is biased to the voltage (Vb+Vr).

Then, the power supply voltage Vcc is applied to only the selected word line connected to the cell-access transistor of the selected memory cell and the cell-access transistor of the selected memory cell is turned on only for a reading time Tread. Here, it is to be noted that the voltage (Vcc−Vb) between the gate and source of the cell-access transistor is set so as to be not less than the threshold voltage of the cell-access transistor. Thus, the variable resistance element of the selected memory cell is biased in forward direction, so that the forward current flows from the bit line to the source line. The readout circuit 13 detects the amount of the reading current flowing in this bit line to read the data. Thus, since the variable resistance element of the selected memory cell is biased in the forward direction and read, the reading disturbance is suppressed.

In addition, since the cell-access transistor is provided in the case of the 1T/1R-type memory cell, it is necessary to apply a control voltage to turn the cell-access transistor on/off. This method of applying the voltage to the bit line and the source line connected to both ends of the variable resistance element, respectively may be performed based on the first embodiment. Here, it is to be noted that the bit line in the second embodiment corresponds to the bit line in the first embodiment, the source line in the second embodiment corresponds to the word line in the first embodiment. Here, it is also to be noted that since the cell-access transistor is provided, it is not necessary to select the source line that is parallel to the word line by the source line decoder 5, so that the source line decoder 5 may be omitted.

Figure 13:
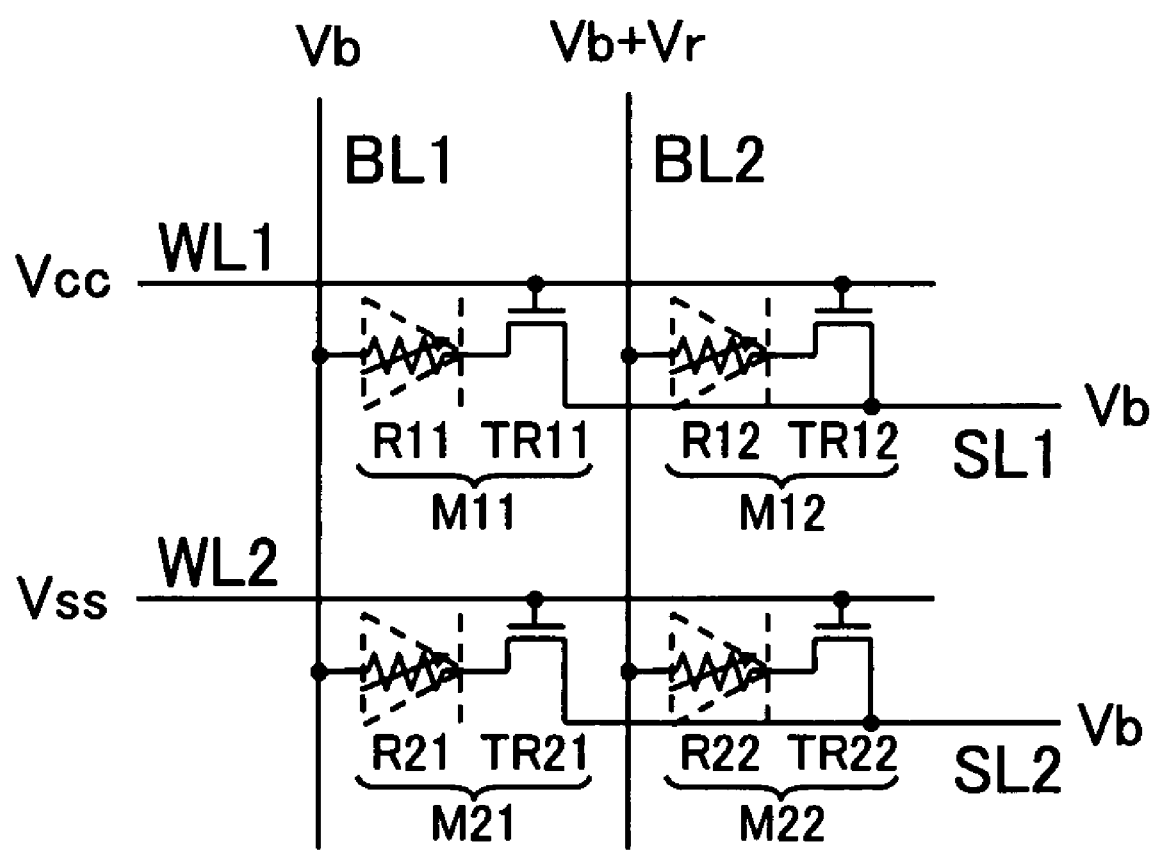
FIG. 13 is a view to explain voltage applying condition to the memory cell array in the reading operation in the second embodiment of nonvolatile semiconductor memory device according to the present invention.

Next, the state in the memory cell array for the reading time Tread in the reading operation will be described taking an example of two word lines, two bit lines and two source lines shown in FIG. 13.

As described above, the variable resistance element of each memory cell is connected such that the current flows from the bit line to the source line in the forward direction. In FIG. 13, the variable resistance element is shown such that the signs of the variable resistance and diode are combined for simplicity.

All bit lines and all source lines are biased to Vb and all word lines are biased to Vss in the memory cell array prior to the reading time and when a memory cell M22 is to be read, for example, the potential of a selected bit line BL2 connected to a variable resistance element R22 of the memory cell M22 is changed from the initial voltage Vb to the voltage Vb+Vr and the power supply voltage Vcc is applied to the selected word line WL2 connected to the gate of a cell-access transistor TR22, whereby the cell-access transistor TR22 is turned on. Thus, the forward reading current flows from the bit line BL2 to a source line SL2 in the variable resistance element R22. The amount of the reading current is read by the readout circuit connected through the bit line decoder.

Although the descriptions have been made of the case where the memory cell is the 1R-type memory cell in the first embodiment and the case where the memory cell is the 1T/1R-type memory cell in the second embodiment, two embodiments in which the memory cell is a 1D/1R-type memory cell will be described. Although the 1D/1R-type memory cell is constituted such that a variable resistance element and a diode serving as a cell-access element form a series circuit, since the variable resistance element has the rectifying characteristics, there are two ways to connect the variable resistance element and the cell-access diode. That is, one way is to connect them such that the forward currents of the two elements flow in the same direction (the anode of one of the variable resistance element and the cell-access diode and the cathode of the other of them are connected) and the other way is to connect them such that the forward currents of the two elements flow in the opposite directions to each other (the anodes or cathodes of the variable resistance element and the diode are connected). The former case will be described in a third embodiment and the latter case will be described in a fourth embodiment.

Third Embodiment

Figure 14:
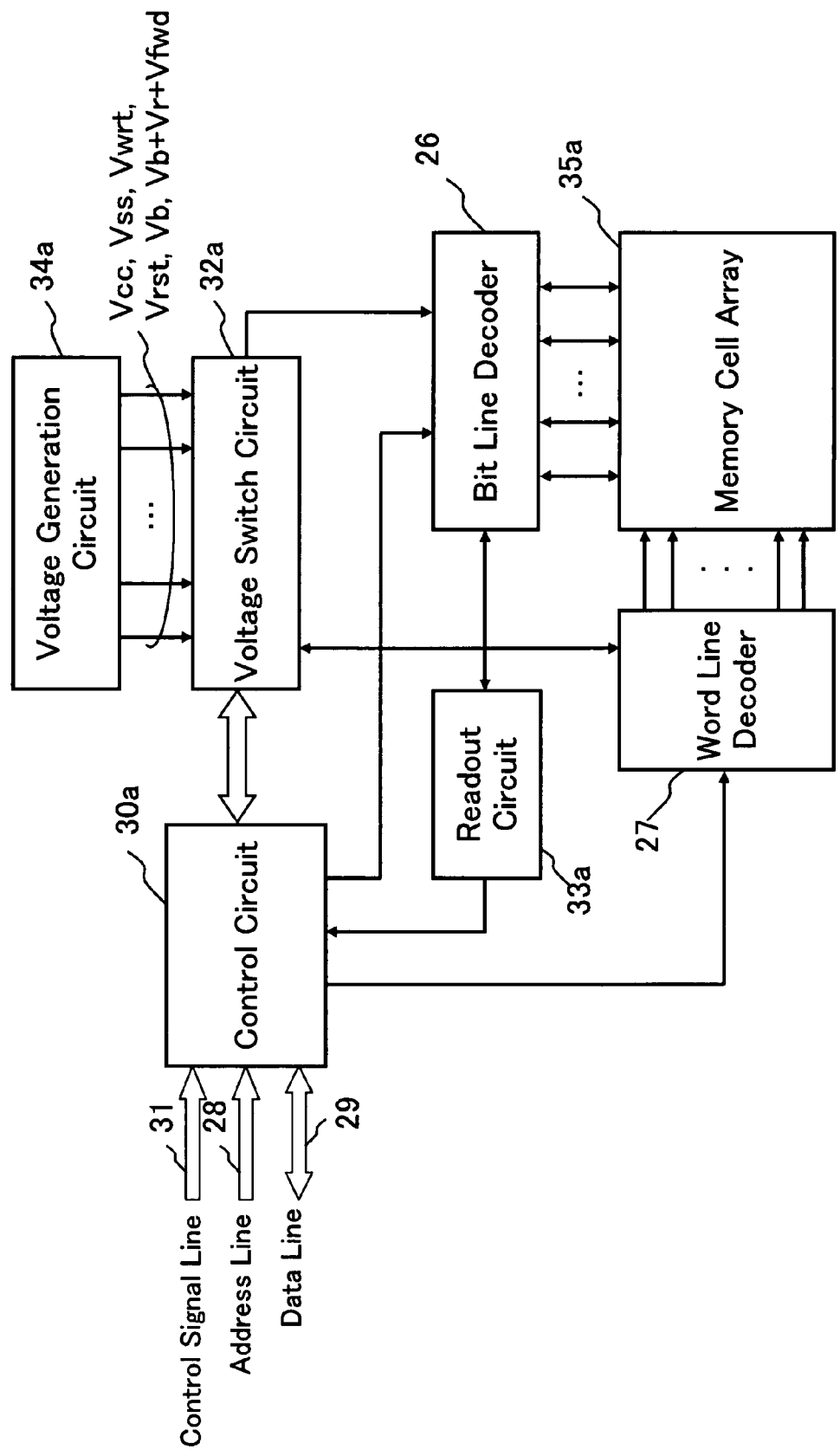
FIG. 14 is a block diagram showing the schematic circuit constitution example in a third embodiment of the nonvolatile semiconductor memory device according to the present invention.

FIG. 14 shows the schematic constitution of a device of the present invention according to the third embodiment. As shown in FIG. 14, although the device of the present invention has the same constitution as that of the 1R-type memory cell basically, since the memory cell comprises a series circuit consisting of a variable resistance element and a cell-access diode, it is necessary to turn on the cell-access diode of the selected memory cell in the reading operation, so that its voltage applying condition is different from that of the 1R-type memory cell. As shown in FIG. 14, the device of the present invention comprises a bit line decoder 26, a word line decoder 27, a voltage switch circuit 32a, a readout circuit 33a, a voltage generation circuit 34a, and a control circuit 30a in the vicinity of a memory cell array 35a in which 1D/1R-type memory cells are arranged in a matrix state.

Figure 15:
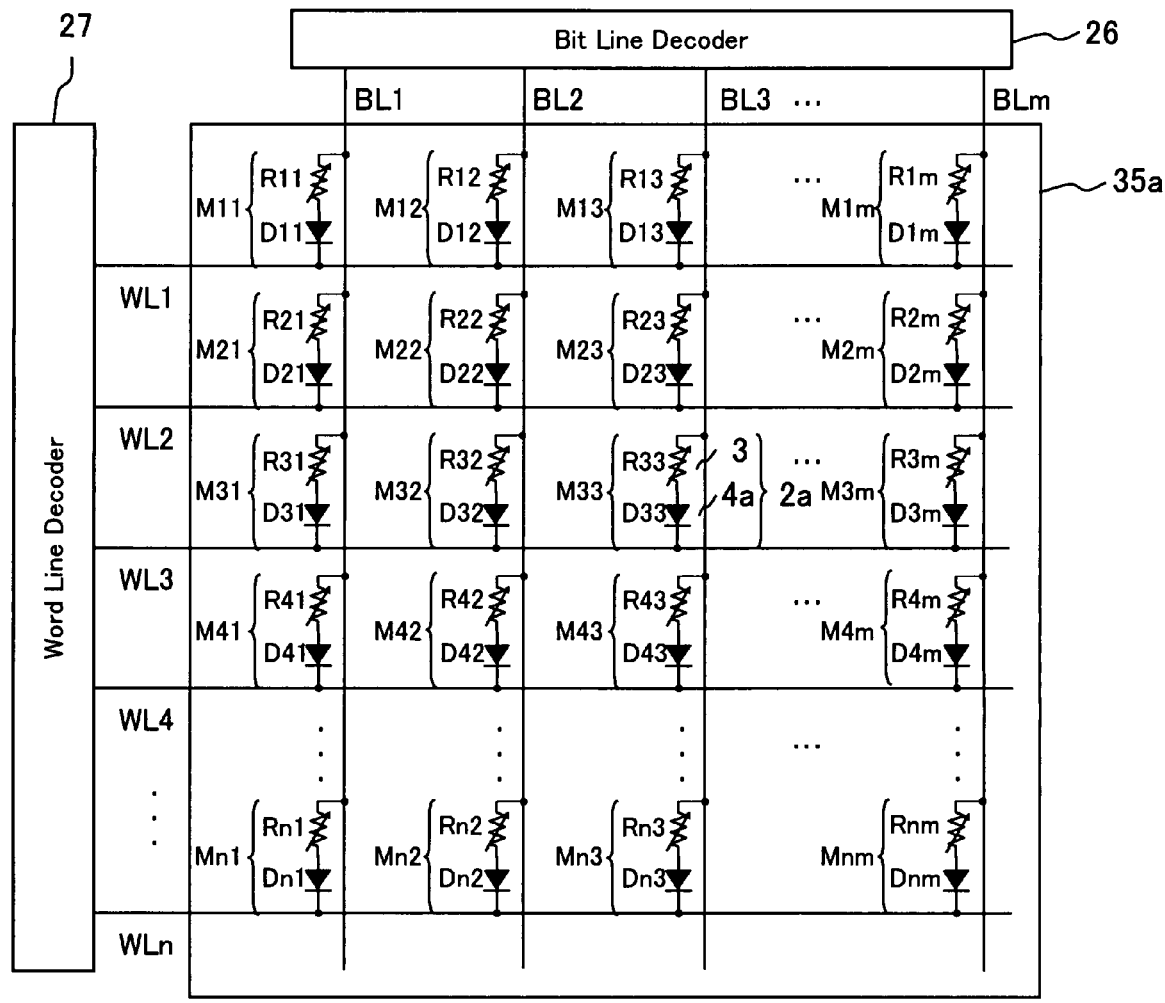
FIG. 15 is a schematic circuit diagram showing one constitution example of a memory cell array having a 1D/1R-type memory cell comprising the variable resistance element and a cell-access diode in the third embodiment of the nonvolatile semiconductor memory device according to the present invention.

As shown in FIG. 15, the memory cell array 35a is constituted such that each of m×n memory cells 2a is arranged at each intersection of m bit lines BL1 to BLm extending in a column direction and n word lines WL1 to WLn extending in a row direction. Each memory cell 2a comprises a variable resistance element 3 and a cell-access diode 4a serving as a cell-access element. The variable resistance element 3 constituting each memory cell 2a has rectifying characteristics and it is connected to the bit line and word line such that the current flowing from the bit line to the word line becomes a forward current of the variable resistance element. That is, the electrode of the variable resistance element 3 as an anode determined by the material of the variable resistance element as shown in FIG. 4 is connected to the bit line, the electrode as a cathode is connected to the anode of the cell-access diode 4a, and the cathode of the cell-access diode 4a is connected to the word line.

The bit line decoder 26 and the word line decoder 27 function as memory cell selection circuits for selecting the memory cell by the row, column or memory cell, so that it selects the memory cell to be read from the memory cell array 35a corresponding to an address inputted from the address line 28 to the control circuit 30a. The word line decoder 27 selects the word line of the memory cell array 35a corresponding to a signal inputted to the address line 28 and the bit line decoder 26 selects the bit line of the memory cell array 35a corresponding to the address signal inputted to the address line 28. According to this embodiment, the bit line decoder 26 and the word line decoder 27 select the memory cell from the memory cell array 35a by the memory cell at the time of reading operation.

The control circuit 30a controls programming, erasing and reading operations of the memory cell array 35a. The control circuit 30a controls the word line decoder 27, the bit line decoder 26, the voltage switch circuit 32a, and the reading, programming and erasing operations of the memory cell array 35a, based on the address signal inputted from the address line 28, the data inputted from the data line 29 (at the time of programming), and the control signal inputted from a control signal line 31. According to the example shown in FIG. 14, the control circuit 30a comprises a general address buffer circuit, a data input/output buffer circuit, a control input buffer circuit although they are not shown.

The voltage switch circuit 32a functions as a voltage supply circuit for switching each voltage of the word line, the bit line and source line needed for reading, programming and erasing in the memory cell array 35a according to an operation mode and supplying it to the memory cell array 35a. In the reading mode especially, the voltage switch circuit 32a applies a predetermined voltage to be described below, to the selected bit line and the word line connected to the memory cell selected by the bit line decoder 26 and the word line decoder 27. According to this embodiment, a predetermined reading voltage is applied to the selected memory cell connected to both bit line and word line selected by the bit line decoder 26 and the word line decoder 27. In the drawing, reference character Vcc denotes the power supply voltage of the device of the present invention, reference character Vss denotes the ground voltage, reference character Vwrt denotes a programming voltage, reference character Vrst denotes an erasing voltage, and reference character Vb denotes a bias voltage of the memory cell array. The voltage Vb+Vr+Vfwd is used in the reading operation and a forward bias voltage Vr+Vfwd is applied to the selected memory cell to turn on the cell-access diode and a forward voltage Vr is applied to the selected variable resistance element as the reading voltage. Here, the voltage Vfwd is a forward ON voltage of the cell-access diode.

The readout circuit 33a converts the reading current flowing in the bit line selected by the bit line decoder 26 among the reading currents flowing in the bit line connected to the selected memory cell, to a voltage and determines the state of data stored in the memory cell to be read, connected to the selected bit line and transfers its result to the control circuit 30a to be outputted to the data line 29.

Figure 16:
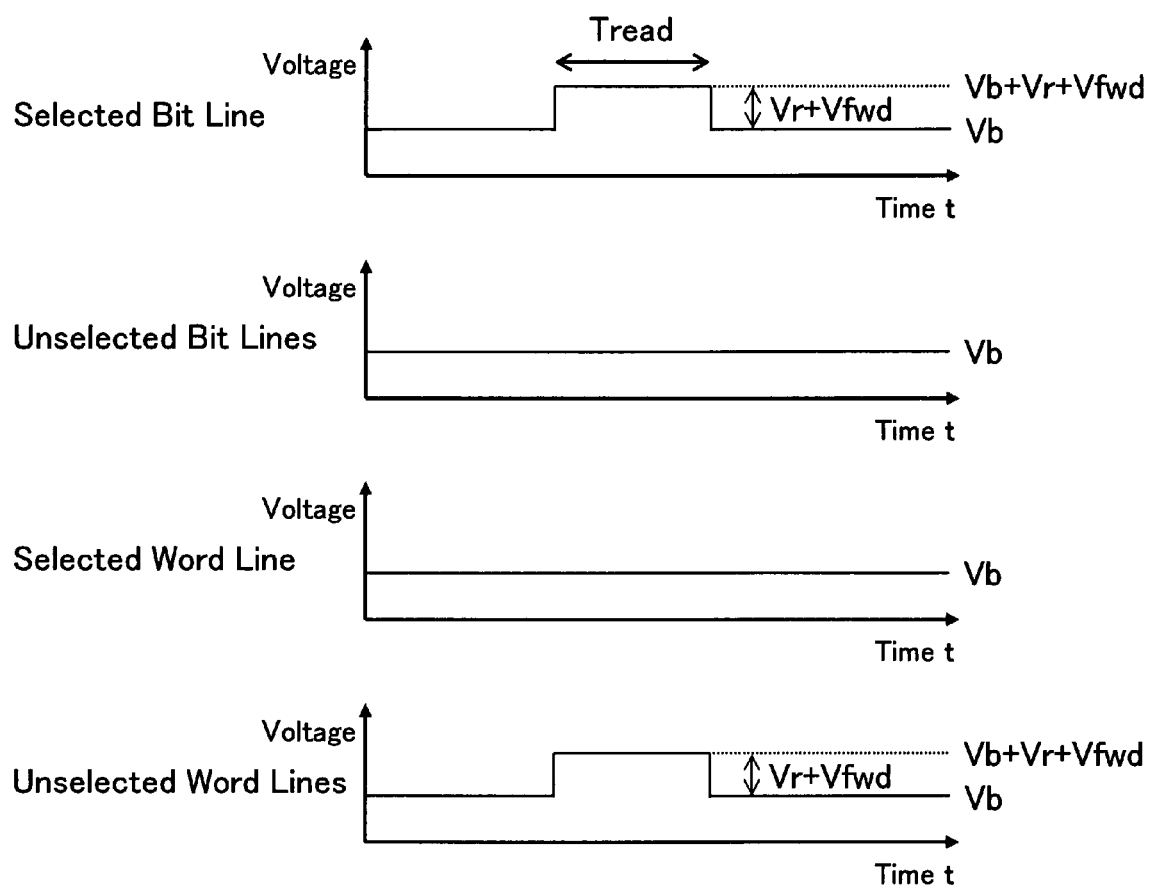
FIG. 16 is a view to explain voltage applying steps to the memory cell array in a reading operation in the third embodiment of nonvolatile semiconductor memory device according to the present invention.

Next, steps of applying the voltage to the memory cell array at the time of reading operation in the third embodiment will be described. As shown in FIG. 16, the memory cell array is biased to Vb initially. That is, the bias voltage Vb is applied to all of the selected word line and selected bit line connected to the selected memory cell to be read, the unselected word lines other than the selected word line, and the unselected bit lines other than the selected bit line. Then, the selected bit line connected to the anode of the variable resistance element of the selected memory cell and the unselected word lines other than the selected word line connected to the cathode of the cell-access diode of the selected memory cell are biased to the voltage (Vb+Vr+Vfwd) for the reading time Tread. The voltage Vfwd is a forward ON voltage of the cell-access diode. Thus, the voltage (Vr+Vfwd) is applied to the selected memory cell based on the cathode of the cell-access diode, and the cell-access diode of the selected memory cell is turned on and the variable resistance element of the selected memory cell is forward biased, so that a forward current flows from the bit line to the word line. The amount of the current flowing in this bit line is detected by the readout circuit 33a to read data. Thus, since the variable resistance element of the selected memory cell is forward biased to read the data, the reading disturbance is suppressed.

Figure 17:
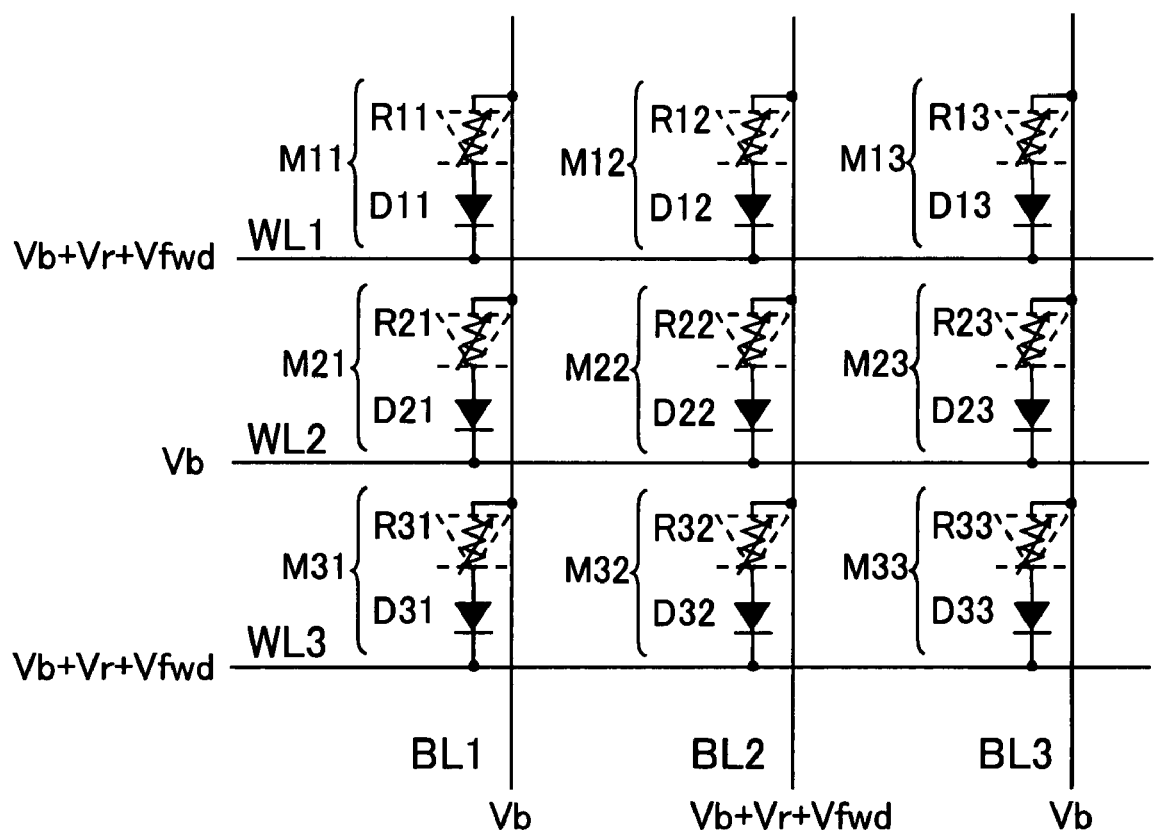
FIG. 17 is a view to explain voltage applying condition to the memory cell array in the reading operation in the third embodiment of nonvolatile semiconductor memory device according to the present invention.

Next, the state in the memory cell array for the reading time Tread in the reading operation will be described taking an example of three word lines and three bit lines shown in FIG. 17.

As described above, the variable resistance element is connected such that the current flows from the bit line to the word line in the forward direction. In FIG. 17, the variable resistance element is shown such that the signs of the variable resistance and diode are combined for simplicity.

The whole memory cell array is biased to Vb prior to the reading time and when a memory cell M22 is to be read, for example, the potential of the selected bit line connected to the memory cell M22 comprising a variable resistance element R22 and a cell-access diode D22 is changed to the voltage Vb+Vr+Vfwd, the potential of the unselected bit lines is remained at the bias voltage Vb, the potential of the selected word line connected to the selected memory cell M22 is remained at the bias voltage Vb, and the potential of other unselected word lines is changed to the voltage Vb+Vr+Vfwd. Thus, the forward voltage Vr+Vfwd is applied to the selected memory cell M22, the cell-access diode D22 is turned on, the forward reading voltage Vr is applied to the variable resistance element R22, and the forward reading current flows from a bit line BL2 to a word line WL2. This reading current is read by the readout circuit 33a connected through the bit line decoder 26. Here, although a reverse voltage minus (Vr+Vfwd) is applied to the unselected memory cells M11, M13, M31 and M33 connected to the unselected bit lines BL1 and BL3 and selected word lines WL1 and WL3, respectively, since the cell-access diodes of these unselected memory cells should not be turned on, it is necessary to set the revease voltage and the forward voltage Vr+Vfwd such that the absolute value |Vr+Vfwd| of the reverse voltage does not become the reverse voltage of the cell-access diode or more.

Fourth Embodiment

Figure 18:
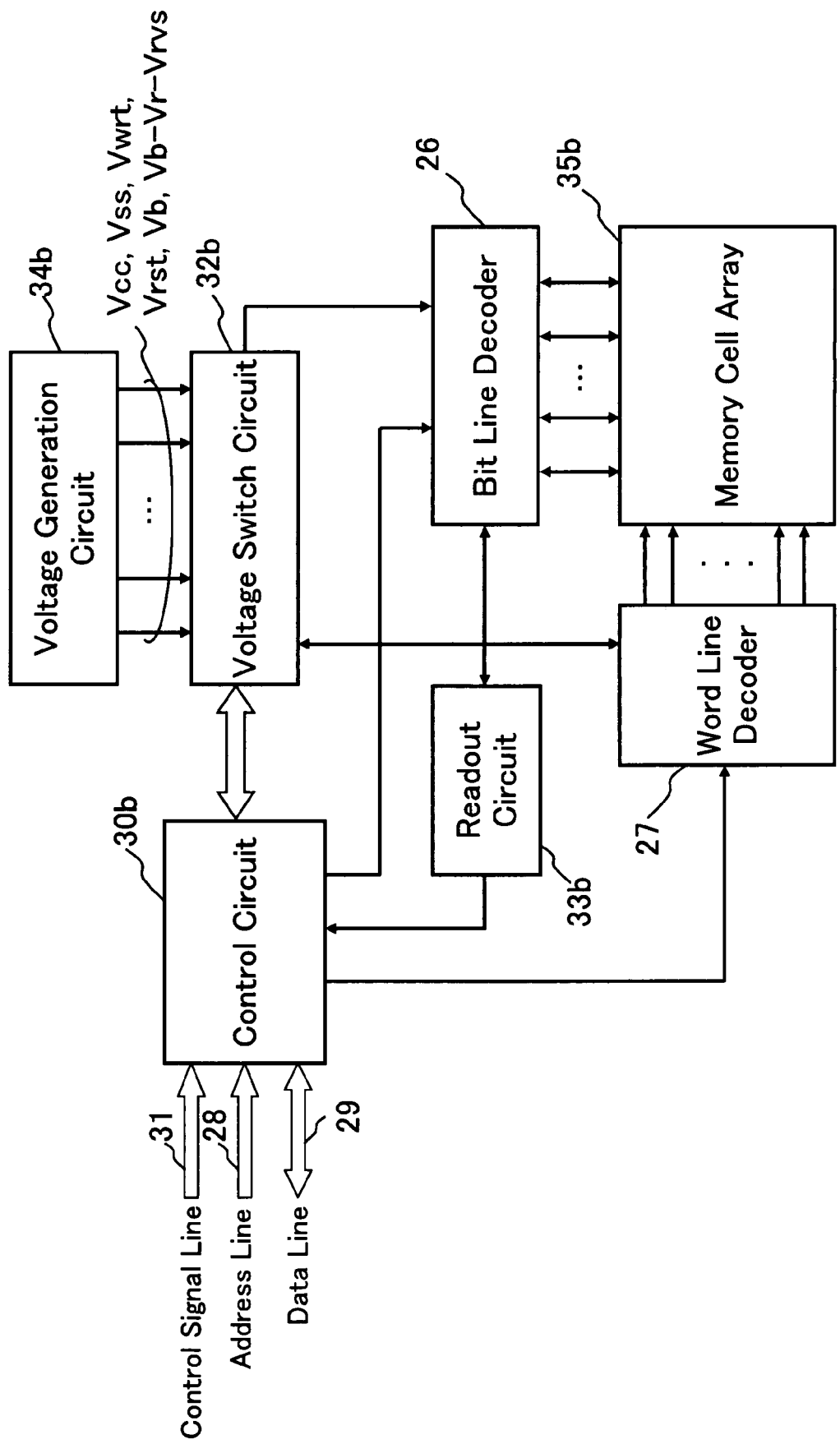
FIG. 18 is a block diagram showing the schematic circuit constitution example in a fourth embodiment of the nonvolatile semiconductor memory device according to the present invention.

FIG. 18 shows the schematic constitution of a device of the present invention according to the fourth embodiment. The device of the present invention in this fourth embodiment is a similar as that of the third embodiment except that the forward currents of a variable resistance element and a cell-access diode connected in series in a memory cell are opposite to each other. As shown in FIG. 18, the device of the present invention comprises a bit line decoder 26, a word line decoder 27, a voltage switch circuit 32b, a readout circuit 33b, a voltage generation circuit 34b, and a control circuit 30b in the vicinity of a memory cell array 35b in which 1D/1R-type memory cells are arranged in a matrix state.

Figure 19:
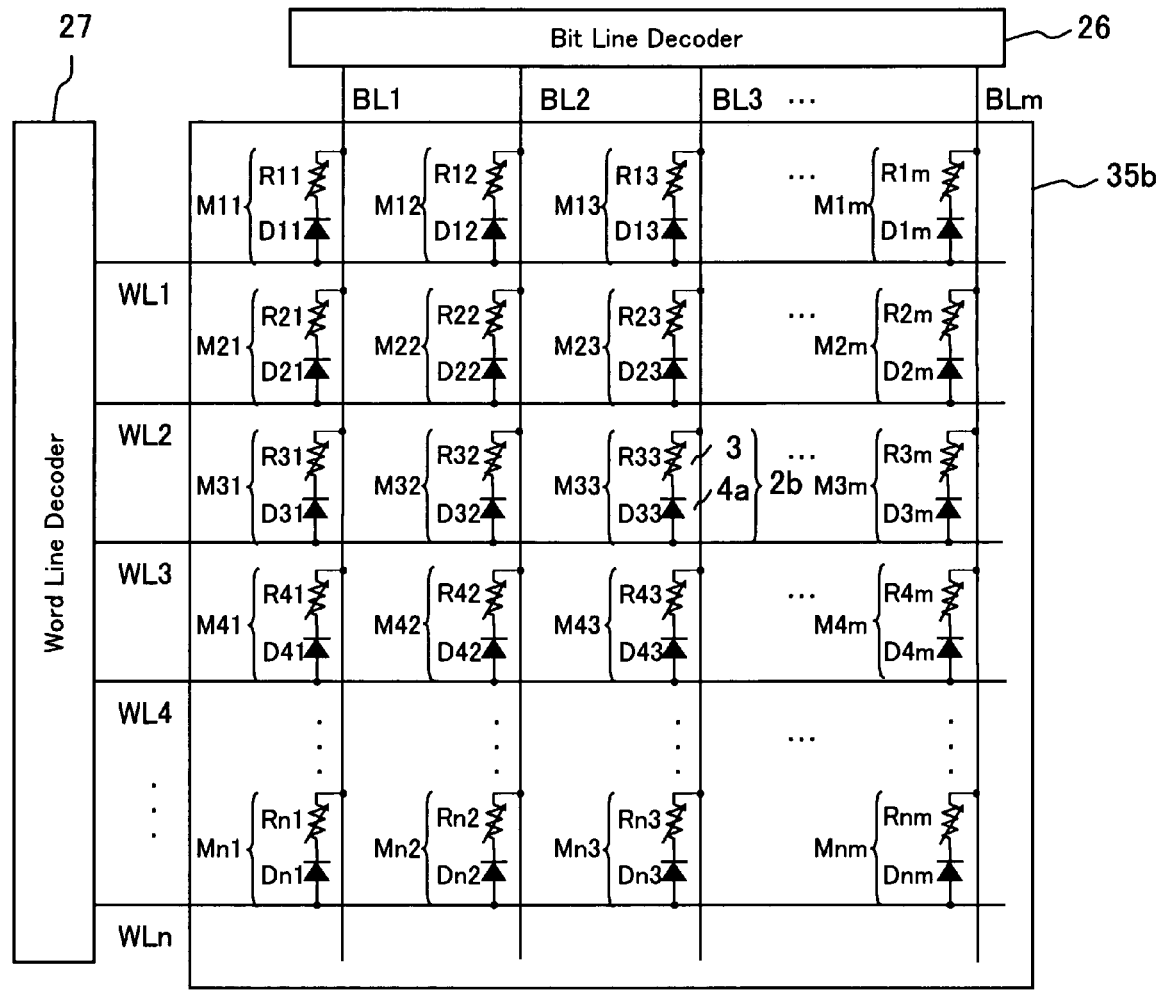
FIG. 19 is a schematic circuit diagram showing one constitution example of a memory cell array having a 1D/1R-type memory cell comprising the variable resistance element and a cell-access diode in the fourth embodiment of the nonvolatile semiconductor memory device according to the present invention.

As shown in FIG. 19, the memory cell array 35b is constituted such that each of m×n memory cells 2b is arranged at each intersection of m bit lines BL1 to BLm extending in a column direction and n word lines WL1 to WLn extending in a row direction. A variable resistance element 3 constituting each memory cell 2b has rectifying characteristics and it is connected to the bit line and word line such that the current flowing from the bit line to the word line becomes a forward current of the variable resistance element. That is, the electrode of the variable resistance element 3 as an anode determined by the material of the variable resistance element as shown in FIG. 4 is connected to the bit line, the electrode as a cathode is connected to the cathode of the cell-access diode 4a, and the anode of the cell-access diode 4a is connected to the word line.

The bit line decoder 26 and the word line decoder 27 function as memory cell selection circuits for selecting the memory cell by the row, column or memory cell, so that it selects the memory cell to be read from the memory cell array 35b corresponding to an address inputted from an address line 28 to the control circuit 30b. The word line decoder 27 selects the word line of the memory cell array 35b corresponding to a signal inputted to the address line 28 and the bit line decoder 26 selects the bit line of the memory cell array 35b corresponding to the address signal inputted to the address line 28. According to this embodiment, the word line decoder 27 selects the memory cell from the memory cell array 35b by the memory cell at the time of reading operation.

The control circuit 30b controls programming, erasing and reading operations of the memory cell array 35b. The control circuit 30b controls the word line decoder 27, the bit line decoder 26, the voltage switch circuit 32b, and the reading, programming and erasing operations of the memory cell array 35b, based on the address signal inputted from the address line 28, the data inputted from a data line 29 (at the time of programming), and the control signal inputted from a control signal line 31. According to the example shown in FIG. 18, the control circuit 30b comprises a general address buffer circuit, a data input/output buffer circuit, a control input buffer circuit although they are not shown.

The voltage switch circuit 32b functions as a voltage supply circuit for switching each voltage of the word line, the bit line and source line needed for reading, programming and erasing in the memory cell array 35b according to an operation mode and supplying it to the memory cell array 35b. In the reading mode especially, the voltage switch circuit 32b applies a predetermined voltage to be described below to the bit lines and the word line connected to the memory cells in one row selected by the word line decoder 27. According to this embodiment, a predetermined reading voltage is applied to the selected memory cells connected to one selected word line selected by the word line decoder 27. In the drawing, reference character Vcc denotes the power supply voltage of the device of the present invention, reference character Vss denotes the ground voltage, reference character Vwrt denotes a programming voltage, reference character Vrst denotes an erasing voltage, and reference character Vb denotes a bias voltage of the memory cell array. The voltage Vb−Vr−Vrvs is used in the reading operation and a voltage Vr+Vrvs is applied to the selected memory cells to turn on the cell-access diodes (reverse breakdown) and a forward voltage Vr is applied to the selected variable resistance elements as the reading voltage. Here, the voltage Vrvs is a reverse breakdown voltage (absolute value) of the cell-access diode.

The readout circuit 33b converts the reading currents flowing in the one or more bit lines selected by the bit line decoder 26 among the reading currents flowing in the bit lines connected to the selected memory cells, to a voltage and determines the state of data stored in the one or more memory cells to be read, connected to the one or more selected bit lines among the memory cells in one row and transfers its result to the control circuit 30b to be outputted to the data line 29.

Figure 20:
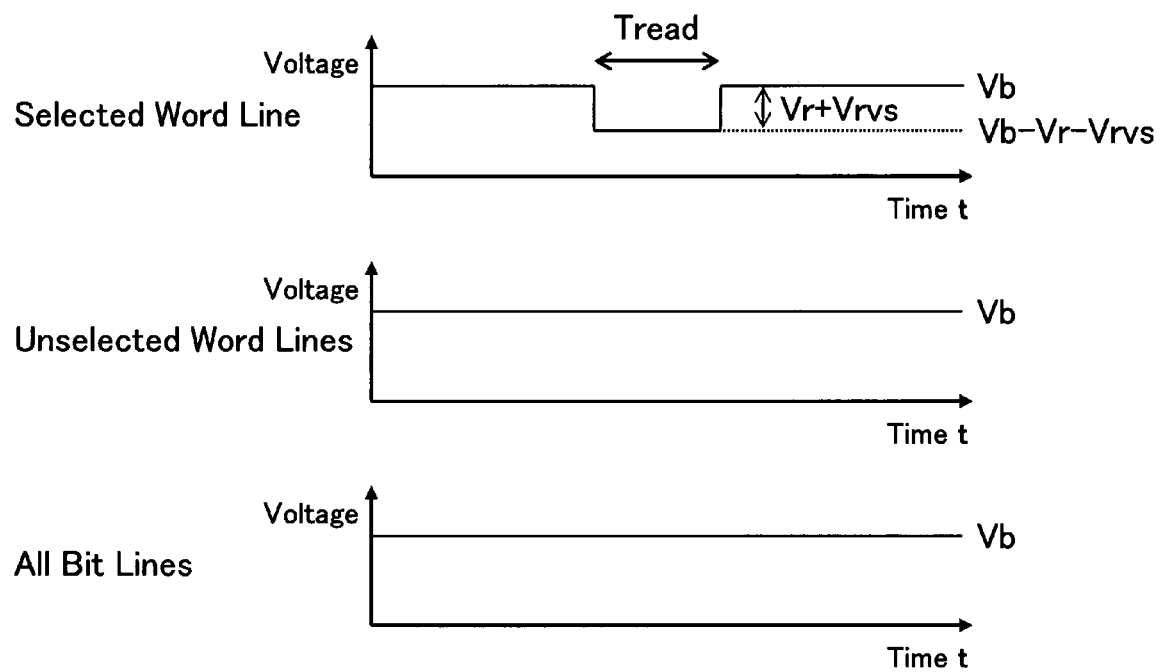
FIG. 20 is a view to explain voltage applying steps to the memory cell array in a reading operation in the fourth embodiment of nonvolatile semiconductor memory device according to the present invention.

Next, steps of applying the voltage to the memory cell array at the time of reading operation in the fourth embodiment will be described. As shown in FIG. 20, the memory cell array is biased to Vb initially. That is, the voltage Vb is applied to all of the selected word line connected to the one or more selected memory cells to be read, the unselected word lines other than the selected word line, and all bit lines (in this embodiment, all bit lines are connected to the selected memory cells). Then, the selected word line connected to the cathode of the variable resistance element of each selected memory cell is biased to the voltage (Vb−Vr−Vrvs) for the reading time Tread. The voltage Vrvs is the reverse breakdown voltage (absolute value) of the cell-access diodes. Thus, the voltage (Vr+Vrvs) is applied to the selected memory cells based on the anodes of the cell-access diodes, and the cell-access diodes of the selected memory cells are turned on (reverse breakdown) and the variable resistance elements of the selected memory cells are forward biased, so that the forward current flows from each bit line to the selected word line. The amount of the current flowing in each bit line is detected by the readout circuit 33b to read the data. Thus, since the variable resistance elements of the selected memory cells are forward biased to read the data, the reading disturbance is suppressed. In addition, although it may be such that the amount of the reading current is detected by the readout circuit 33b only for one or more bit lines selected by the bit line decoder 26 and the data of the one or more selected memory cells selected by the bit line decoder 26 is read, the fact remains that the other memory cells that are not selected by the bit line decoder 26 are also forwardly biased.

Figure 21:
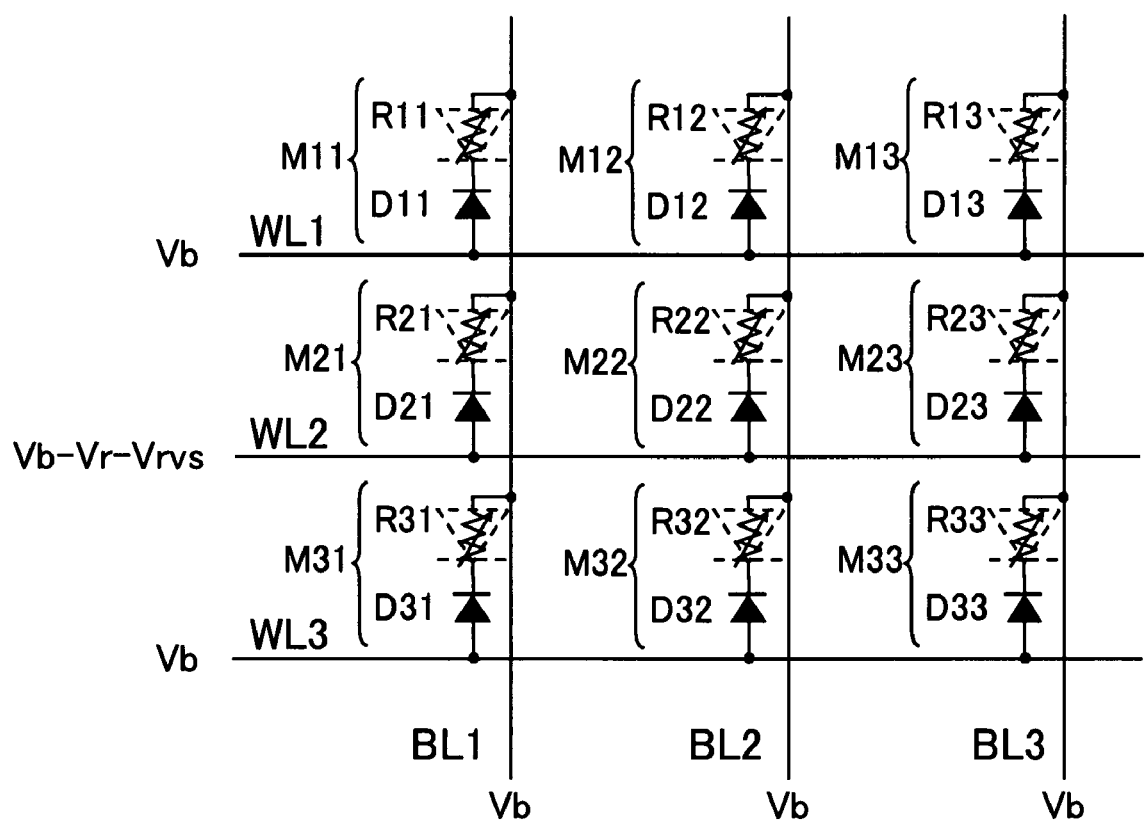
FIG. 21 is a view to explain voltage applying condition to the memory cell array in the reading operation in the fourth embodiment of nonvolatile semiconductor memory device according to the present invention.

Then, the state in the memory cell array for the reading time Tread in the reading operation will be described taking an example of three word lines and three bit lines shown in FIG. 21.

As described above, the variable resistance element is connected such that the current flows from the bit line to the word line in the forward direction. In FIG. 21, the variable resistance element is shown such that the signs of the variable resistance and diode are combined for simplicity.

The whole memory cell array is biased to Vb prior to the reading time and when a memory cell M22 is to be read, for example, the potential of a selected word line WL2 connected to the memory cell M22 comprising a variable resistance element R22 and a cell-access diode D22 is changed from the initial voltage Vb to the voltage Vb−Vr−Vrvs. Thus, the voltage Vr+Vrvs (that is a forward bias for the variable resistance element R22 and a reverse bias for the cell-access diode D22) is applied to the selected memory cell M22, the cell-access diode D22 is turned on (reverse breakdown), the forward reading voltage Vr is applied to the variable resistance element R22, and the forward reading current flows from a bit line BL2 to a word line WL2. This reading current is read by the readout circuit 33b connected through the bit line decoder 26. Here, since the voltage Vr+Vrvs is also applied to other selected memory cells M21 and M23, the cell-access diodes D21 and D23 are turned on (reverse breakdown), the forward reading voltage Vr is applied to the variable resistance elements R21 and R23, and the forward reading current flows from the bit lines BL1 and BL3 to the word line WL2, so that these reading current in the other selected memory cells M21 and M23 may be read at the same time.

It is to be noted in the case of the fourth embodiment that since the absolute value of the reverse breakdown voltage Vrvs of the cell-access diode in each memory cell is greater than the forward ON voltage Vfwd in a normal state, when the potential of the selected bit line and unselected word lines is changed from the initial voltage Vb to the voltage (Vb+Vr+Vrvs) like the third embodiment, the voltage Vr+Vrvs is applied to the selected memory cell connected to both selected bit line and selected word line, the cell-access diode is turned on (reverse breakdown), and the forward reading voltage Vr is applied to the variable resistance element, so that the forward reading current flows from the selected bit line to the selected word line. However, since the reverse voltage minus (Vr+Vrvs) is applied to the unselected memory cells connected to both unselected bit lines and unselected word lines, the cell-access diode is turned on by the forward bias, and the reading voltage (Vr+Vrvs−Vfwd) is applied to the variable resistance element by the reverse bias, when the variable resistance element is in the low resistant state, the reading disturbance becomes obvious. Therefore, according to the fourth embodiment, it is necessary to prevent the cell-access diode of the unselected memory cells from being forward biased by selecting the memory cell by the row or by the column.

Next, other embodiments of the device of the present invention will be described.

(1) Although the description has been made of the case where the memory cell array comprises memory cell structures such as the 1R-type memory cell, the 1T/1R-type memory cell, and the 1D/1R-type memory cell in the above embodiments, the memory cell structure may be any structure as long as the current direction flowing in the variable resistance element of the selected memory cell can be controlled. In addition, the cell-access transistor of the 1T/1R-type memory cell is not limited to the N type MOSFET but may be a P type MOSFET or a bipolar transistor.

(2) Although the constitution in which the source line extending in the row direction is provided for each row as shown in FIG. 10, as the memory cell array constitution of the 1T/1R-type memory cell in the second embodiment, the memory cell array structure of the 1T/1R-type memory cell is not limited to the constitution in the above embodiment. For example, the source line may extend in parallel to the bit line in the column direction.

Furthermore, the relation between the bit line and the source line in the constitution shown in FIG. 10 may be reversed. In this case, the readout circuit 13 is connected to the source line decoder 5.

(3) Although the 1T/1R-type memory cell is such that the electrode of the variable resistance element 3 as the anode determined by the material of the variable resistance element as shown in FIG. 4 is connected to the bit line and the electrode as the cathode is connected to the drain of the cell-access transistor 4, the source of the cell-access transistor 4 is connected to the source line, and the gate of the cell-access transistor 4 is connected to the word line in the above second embodiment, it may be such that the positions of the variable resistance element 3 and the cell-access transistor 4 is exchanged so that the drain of the cell-access transistor 4 is connected to the bit line, the gate of the cell-access transistor 4 is connected to the word line, the electrode of the variable resistance element 3 as the anode determined by the material of the variable resistance element as shown in FIG. 4 is connected to the source of the cell-access transistor 4, and the electrode of the variable resistance element 3 as the cathode is connected to the source line.

(4) Although the case where the reading operation is performed by selecting one word line, and selecting the reading currents flowing in the selected memory cells connected to that word line on the side of the bit lines has been described in the above first embodiment, the reading operation may be performed such that the relation between the word line and the bit line is reversed so that one bit line is selected and the reading currents flowing in the selected memory cells connected to the selected bit line are selected on the side of the word lines. In this case, the readout circuit 23 is connected to the word line decoder 17.

(5) Although the case where one word line and one bit line are selected and the reading current flowing in the selected memory cell connected to both the selected word line and the selected bit line is read on the side of the bit line has been described in the third embodiment, it may be such that the relation between the word line and the bit line is reversed and reading is performed on the side of the word line. In this case, the readout circuit 33a is connected to the word line decoder 27.

In addition, similar to the first embodiment, it may be such that one word line is selected and the reading current flowing in the selected memory cells connected to the above selected word line is selected on the bit side and read. Furthermore, it may be such that the relation between the word line and the bit line is reversed, and one bit line is selected and the reading currents flowing in the selected memory cells connected to the above selected bit line are selected on the word line side and read. In the latter case, the readout circuit 33a is connected to the word line decoder 27.

(6) Although the 1D/1R-type memory cell is such that the electrode of the variable resistance element 3 as the anode determined by the material of the variable resistance element as shown in FIG. 4 is connected to the bit line and the electrode as the cathode is connected to the anode of the cell-access diode 4a, the cathode of the cell-access diode 4a is connected to the word line in the above third embodiment, it may be such that the positions of the variable resistance element 3 and the cell-access diode 4a are exchanged so that the anode of the cell-access diode 4a is connected to the bit line, the electrode of the variable resistance element 3 as the anode determined by the material of the variable resistance element as shown in FIG. 4 is connected to the cathode of the cell-access diode 4a, and the cathode of the variable resistance element 3 is connected to the word line.

(7) Although the case where the reading operation is performed by selecting one word line and the reading currents flowing in the selected memory cells connected to that selected word line on the side of the bit line has been described in the above fourth embodiment, it may be such that the relation between the word line and the bit line is reversed so that one bit line is selected and the reading currents flowing in the selected memory cells connected to the selected bit line are selected on the side of the word line. In this case, the readout circuit 33b is connected to the word line decoder 27.

(8) Although the 1D/1R-type memory cell is such that the electrode of the variable resistance element 3 as the anode determined by the material of the variable resistance element as shown in FIG. 4 is connected to the bit line and the electrode as the cathode is connected to the anode of the cell-access diode 4a, and the cathode of the cell-access diode 4a is connected to the word line in the above fourth embodiment, it may be such that the positions of the variable resistance element 3 and the cell-access diode 4a are exchanged so that the anode of the cell-access diode 4a is connected to the bit line, the electrode of the variable resistance element 3 as the anode determined by the material of the variable resistance element as shown in FIG. 4 is connected to the cathode of the cell-access diode 4a, and the cathode of the variable resistance element 3 is connected to the word line.

(9) Although each of the voltage switch circuits, 22, 12, 32a and 32b shown in FIGS. 5, 10, 14 and 18, respectively generates the voltages for programming, erasing and reading in the above embodiments, one circuit may generate the voltage for each operation.

(10) Although the description has been made of the case where some kind of voltage is applied to the selected bit line, the unselected bit lines and the source lines constantly in the reading operation in the above second embodiment, the unselected bit lines or a part of the source lines connected to the unselected memory cells may be in a floating state (where a voltage is not applied).

Furthermore, in the first, third and fourth embodiments also, as long as the forward reading current flows to the variable resistance element of the selected memory cell, and reading can be performed by the readout circuit, and the reverse bias is not applied to the variable resistance elements of the unselected memory cells, a part of the unselected bit lines or unselected word lines may be in the floating state (voltage is not applied).

The present invention can be applied to a nonvolatile semiconductor memory device having a memory cell array in which memory cells each comprising a variable resistance element that stores information in response to the change of an electric resistance are arranged in a row direction and a column direction, and especially useful in preventing stored data from deteriorating due to the reading operation of the memory cell array.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A nonvolatile semiconductor memory device comprising:
    a memory cell array including a plurality of memory cells arranged in a row direction and a column direction, the memory cell including a variable resistance element having a laminated structure comprising a rectifier junction showing rectifying characteristics in current-voltage characteristics and two electrodes for applying a voltage to the rectifier junction, the variable resistance element exhibiting current-voltage characteristics so that a positive bias current flowing when a positive voltage is applied based on one of the two electrodes as a reference electrode to the other electrode is larger than a negative bias current flowing when a negative voltage is applied to the other electrode, the current-voltage characteristics is asymmetric with respect to a voltage polarity applied to the other electrode, the variable resistance element being capable of storing information by a change of an electric resistance due to voltage application between the two electrodes;
    a memory cell selection circuit for selecting the memory cell from the memory cell array by the row, column or memory cell;
    a voltage supplying circuit for supplying a predetermined voltage according to a writing operation and reading operation, to one or more selected memory cells selected by the memory cell selection circuit through the memory cell selection circuit; and
    a readout circuit for reading the information stored in the selected memory cell by detecting the amount of a reading current flowing in accordance with a voltage applied to the variable resistance element of the selected memory cell and a resistance state of the variable resistance element in the reading operation for the selected memory cell, wherein
    the memory cell selection circuit and the voltage supplying circuit apply a predetermined positive voltage according to the reading operation based on the reference electrode to the other electrode in the variable resistance element of the selected memory cell, and the readout circuit detects the amount of the positive bias current flowing from the other electrode to the reference electrode to read the information stored in the selected memory cell, in the reading operation for the selected memory cell.

2. The nonvolatile semiconductor memory device according to claim 1, wherein the memory cell selection circuit selects the memory cell from the memory cell array by the row or column.

3. The nonvolatile semiconductor memory device according to claim 1, wherein
    the memory cell comprises the variable resistance element only, and
    the memory cell array comprises a plurality of row selection lines extending in a row direction and a plurality of column selection lines extending in a column direction, and each of the memory cells in the same row is connected at one end of the variable resistance element to the same row selection line, and each of the memory cells in the same column is connected at the other end of the variable resistance element to the same column selection line.

4. The nonvolatile semiconductor memory device according to claim 1, wherein the memory cell comprises a series circuit including the variable resistance element and a cell-access transistor, and the memory cell array comprises a plurality of row selection lines extending in a row direction and a plurality of column selection lines extending in a column direction, each of the memory cells in the same row is connected at a gate of the cell-access transistor to the same row selection line, each of the memory cells in the same column is connected at one end of the series circuit to the same column selection line, and each of the memory cells is connected at the other end of the series circuit to a source line, and the memory cell selection circuit selects at least one from the memory cells in the same row in the memory cell array.

5. The nonvolatile semiconductor memory device according to claim 1, wherein the memory cell comprises a series circuit including the variable resistance element and a cell-access diode, and the memory cell array comprises a plurality of row selection lines extending in a row direction and a plurality of column selection lines extending in a column direction, each of the memory cells in the same row is connected at one end of the series circuit to the same row selection line, and each of the memory cells in the same column is connected at the other end of the series circuit to the same column selection line, and the memory cell selection circuit selects at least one from the memory cells in the same row or column in the memory cell array.

6. The nonvolatile semiconductor memory device according to claim 1, wherein the rectifier junction is a schottky junction.

7. The nonvolatile semiconductor memory device according to claim 1, wherein the rectifier junction is a p-n junction.

8. The nonvolatile semiconductor memory device according to claim 1, wherein the rectifier junction is a hetero junction.

9. The nonvolatile semiconductor memory device according to claim 8, wherein the hetero junction is a p-n junction.

10. The nonvolatile semiconductor memory device according to claim 8, wherein the hetero junction comprises semiconductors having the same conductivity type.

11. The nonvolatile semiconductor memory device according to claim 1, wherein at least one of two materials constituting the rectifier junction is a perovskite-type metal oxide.

12. The nonvolatile semiconductor memory device according to claim 1, wherein the two materials constituting the rectifier junction are a perovskite-type metal oxide.

* * * * *